(12) United States Patent
Moloudi

(10) Patent No.: US 8,718,563 B2
(45) Date of Patent: May 6, 2014

(54) SYSTEM AND METHOD FOR SIGNAL LIMITING

(75) Inventor: Shervin Moloudi, Los Angeles, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/225,700

(22) Filed: Sep. 6, 2011

(65) Prior Publication Data

US 2012/0032723 A1 Feb. 9, 2012

Related U.S. Application Data

(63) Continuation of application No. 10/957,043, filed on Oct. 1, 2004, now Pat. No. 8,014,724, which is a continuation-in-part of application No. 09/634,552, filed on Aug. 8, 2000, now Pat. No. 7,555,263, application No. 13/225,700, which is a continuation-in-part of application No. 10/409,213, filed on Apr. 8, 2003, now Pat. No. 6,801,092.

(60) Provisional application No. 60/160,806, filed on Oct. 21, 1999, provisional application No. 60/163,487, filed on Nov. 4, 1999, provisional application No. 60/163,398, filed on Nov. 4, 1999, provisional application No. 60/164,442, filed on Nov. 9, 1999, provisional application No. 60/164,194, filed on Nov. 9, 1999, provisional application No. 60/164,314, filed on Nov. 9, 1999, provisional application No. 60/165,234, filed on Nov. 11, 1999, provisional application No. 60/165,239, filed on Nov. 11, 1999, provisional application No. 60/165,356, filed on Nov. 12, 1999, provisional application No. 60/165,355, filed on Nov. 12, 1999, provisional application No. 60/172,348, filed on Dec. 16, 1999, provisional application No. 60/201,335, filed on May 2, 2000, provisional application No. 60/201,157, filed on May 2, 2000, provisional application No. 60/201,179, filed on May 2, 2000, provisional application No. 60/202,997, filed on May 10, 2000, provisional application No. 60/201,330, filed on May 2, 2000.

(51) Int. Cl.
H04B 1/00 (2006.01)
H04B 15/00 (2006.01)

(52) U.S. Cl.
USPC ........... 455/63.1; 455/296; 455/20; 455/118; 455/306; 455/258; 455/323; 375/133; 375/148; 375/322; 375/285; 375/346; 331/11; 331/16; 369/44.34; 369/44.41

(58) Field of Classification Search
USPC ........... 455/63.1, 20, 296, 306, 258, 323, 39; 375/133, 148, 322, 285, 346; 331/11, 331/16; 369/44.41, 44.34
See application file for complete search history.

(56) References Cited

U.S. PATENT DOCUMENTS

| | | | |
|---|---|---|---|
| 3,742,149 A | 6/1973 | Yoshida et al. | |
| 3,932,814 A | 1/1976 | Niki | |
| 4,129,832 A | 12/1978 | Neal et al. | |
| 4,161,694 A | 7/1979 | Weber et al. | |
| 4,297,650 A | 10/1981 | Shinmyo | |
| 4,328,591 A | 5/1982 | Baghdady | |
| 4,429,418 A | 1/1984 | Hooper | |
| 4,460,872 A | 7/1984 | Mattisson | |
| 4,499,435 A | 2/1985 | Thomson et al. | |
| 4,580,289 A | 4/1986 | Enderby | |
| 4,581,593 A | 4/1986 | Okanobu | |
| 4,723,318 A | 2/1988 | Marshall | |
| 4,768,187 A | 8/1988 | Marshall | |
| 4,811,021 A | 3/1989 | Yoshimoto et al. | |
| 4,812,849 A | 3/1989 | Otto | |
| 4,852,123 A | 7/1989 | Bickley et al. | |
| 4,868,810 A | 9/1989 | Vary et al. | |
| 4,876,737 A | 10/1989 | Woodworth et al. | |
| 4,882,549 A | 11/1989 | Galani et al. | |
| 4,893,316 A | 1/1990 | Janc et al. | |
| 4,914,408 A | 4/1990 | Voorman | |
| 4,920,320 A * | 4/1990 | Matthews | 327/159 |
| 4,926,499 A * | 5/1990 | Kobayashi et al. | 455/306 |
| 4,994,767 A | 2/1991 | Hawkes | |

| | | |
|---|---|---|
| 4,999,596 A | 3/1991 | Nakatani et al. |
| 5,014,021 A | 5/1991 | Robertson, Jr. et al. |
| 5,019,790 A | 5/1991 | Kapetanic |
| 5,033,110 A | 7/1991 | Harman |
| 5,108,334 A | 4/1992 | Eschenbach et al. |
| 5,123,008 A | 6/1992 | Beesley |
| 5,128,625 A * | 7/1992 | Yatsuzuka et al. ............ 327/156 |
| 5,146,186 A | 9/1992 | Vella |
| 5,155,452 A | 10/1992 | Ueda et al. |
| 5,177,450 A | 1/1993 | Lee et al. |
| 5,179,725 A | 1/1993 | Camp, Jr. et al. |
| 5,179,728 A | 1/1993 | Sowadski |
| 5,208,804 A | 5/1993 | Wilson et al. |
| 5,212,459 A | 5/1993 | Ueda et al. |
| 5,235,335 A | 8/1993 | Hester et al. |
| 5,243,302 A | 9/1993 | Camp, Jr. et al. |
| 5,249,201 A | 9/1993 | Posner et al. |
| 5,249,204 A * | 9/1993 | Funderburk et al. ......... 375/344 |
| 5,281,924 A | 1/1994 | Maloberti et al. |
| 5,347,229 A | 9/1994 | Suckling et al. |
| 5,353,311 A * | 10/1994 | Hirata et al. ................. 375/135 |
| 5,374,903 A | 12/1994 | Blanton |
| 5,375,146 A | 12/1994 | Chalmers |
| 5,434,569 A | 7/1995 | Yung et al. |
| 5,451,910 A | 9/1995 | Guthrie |
| 5,465,414 A | 11/1995 | Moskaluk et al. |
| 5,537,459 A | 7/1996 | Price et al. |
| 5,559,473 A | 9/1996 | Anderson et al. |
| 5,572,551 A | 11/1996 | Kearney et al. |
| 5,583,892 A | 12/1996 | Drakul et al. |
| 5,600,283 A | 2/1997 | Sauer |
| 5,614,864 A | 3/1997 | Stubbe et al. |
| 5,631,606 A | 5/1997 | Tran |
| 5,636,213 A | 6/1997 | Eastmond et al. |
| 5,654,708 A | 8/1997 | Boehl et al. |
| 5,661,439 A | 8/1997 | Watkins et al. |
| 5,703,525 A | 12/1997 | Winterer |
| 5,715,529 A | 2/1998 | Kianush et al. |
| 5,724,001 A * | 3/1998 | Chang .......................... 329/302 |
| 5,729,607 A | 3/1998 | DeFries et al. |
| 5,734,674 A | 3/1998 | Fenton et al. |
| 5,787,123 A | 7/1998 | Okada et al. |
| 5,793,359 A | 8/1998 | Ushikubo |
| 5,794,131 A | 8/1998 | Cairns |
| 5,796,850 A | 8/1998 | Shiono et al. |
| 5,805,017 A | 9/1998 | Razzell |
| 5,808,509 A * | 9/1998 | Baltus et al. ................. 329/300 |
| 5,818,830 A | 10/1998 | Daane et al. |
| 5,850,415 A * | 12/1998 | Hunsinger et al. ........... 375/216 |
| 5,872,810 A | 2/1999 | Philips et al. |
| 5,892,409 A | 4/1999 | Boerstler |
| 5,905,398 A | 5/1999 | Todsen et al. |
| 5,909,463 A | 6/1999 | Johnson et al. |
| 5,940,435 A | 8/1999 | Hendrickson et al. |
| 5,940,456 A | 8/1999 | Chen et al. |
| 5,952,895 A | 9/1999 | McCune et al. |
| 5,953,640 A | 9/1999 | Meador et al. |
| 5,995,539 A | 11/1999 | Miller |
| 6,011,824 A | 1/2000 | Oikawa et al. |
| 6,016,080 A | 1/2000 | Zuta et al. |
| 6,026,287 A | 2/2000 | Puechberty et al. |
| 6,035,001 A | 3/2000 | Eklund et al. |
| 6,061,551 A | 5/2000 | Sorrells et al. |
| 6,064,277 A | 5/2000 | Gilbert |
| 6,072,994 A | 6/2000 | Phillips et al. |
| 6,091,940 A | 7/2000 | Sorrells et al. |
| 6,094,463 A | 7/2000 | Stephens et al. |
| 6,097,762 A * | 8/2000 | Suzuki et al. ................. 375/259 |
| 6,111,911 A | 8/2000 | Sanderford et al. |
| 6,134,453 A | 10/2000 | Sainton et al. |
| 6,148,048 A | 11/2000 | Kerth et al. |
| 6,154,484 A | 11/2000 | Lee et al. |
| 6,178,217 B1 | 1/2001 | DeFries et al. |
| 6,185,418 B1 | 2/2001 | MacLellan et al. |
| 6,201,785 B1 | 3/2001 | Fouche et al. |
| 6,204,810 B1 | 3/2001 | Smith |
| 6,212,246 B1 | 4/2001 | Hendrickson et al. |
| 6,219,376 B1 * | 4/2001 | Zhodzishsky et al. ........ 375/148 |
| 6,256,337 B1 | 7/2001 | Hendrickson et al. |
| 6,263,017 B1 | 7/2001 | Miller |
| 6,271,790 B2 | 8/2001 | Smith |
| 6,298,244 B1 | 10/2001 | Boesch et al. |
| 6,304,623 B1 | 10/2001 | Richards et al. |
| 6,333,679 B1 | 12/2001 | Eriksson |
| 6,343,207 B1 | 1/2002 | Hessel et al. |
| 6,353,735 B1 | 3/2002 | Sorrells et al. |
| 6,366,622 B1 | 4/2002 | Brown et al. |
| 6,377,608 B1 | 4/2002 | Zyren |
| 6,510,175 B1 * | 1/2003 | Hunsinger et al. ........... 375/216 |
| 6,522,868 B1 | 2/2003 | Stilwell |
| 6,526,034 B1 | 2/2003 | Gorsuch |
| 6,526,262 B1 | 2/2003 | Kurlovich |
| 6,532,256 B2 | 3/2003 | Miller |
| 6,542,724 B1 | 4/2003 | Copeland et al. |
| 6,563,859 B1 | 5/2003 | Oishi et al. |
| 6,577,691 B2 | 6/2003 | Richards et al. |
| 6,591,091 B1 * | 7/2003 | Vorenkamp et al. ........ 455/179.1 |
| 6,594,613 B1 * | 7/2003 | Ley et al. ...................... 702/140 |
| 6,603,801 B1 | 8/2003 | Andren et al. |
| 6,633,617 B1 | 10/2003 | Cooklev |
| 6,658,237 B1 | 12/2003 | Rozenblit et al. |
| 6,678,310 B1 | 1/2004 | Andren et al. |
| 6,693,974 B2 | 2/2004 | Jin et al. |
| 6,714,776 B1 | 3/2004 | Birleson |
| 6,738,601 B1 | 5/2004 | Rofougaran et al. |
| 6,757,334 B1 | 6/2004 | Feher |
| 6,765,931 B1 | 7/2004 | Rabenko et al. |
| 6,922,555 B1 | 7/2005 | Mohindra |
| 6,950,485 B2 | 9/2005 | Richards et al. |
| 6,996,377 B1 * | 2/2006 | Yamawaki et al. ............. 455/86 |
| 7,068,987 B2 * | 6/2006 | Baldwin et al. ............ 455/232.1 |
| 7,092,043 B2 * | 8/2006 | Vorenkamp et al. .......... 348/726 |
| 7,236,212 B2 * | 6/2007 | Carr et al. ..................... 348/726 |
| 8,014,724 B2 * | 9/2011 | Moloudi ....................... 455/63.1 |

FOREIGN PATENT DOCUMENTS

EP 0803997 A2 10/1997

OTHER PUBLICATIONS

Rofougaran, Ahmadreza, "A Single-Chip Spread-Spectrum Wireless Transceiver in CMOS," Final Report, Integrated Circuits & Systems Laboratory Electrical Engineering Department, University of California, Los Angeles, CA 1999, 339 pgs.

* cited by examiner

*Primary Examiner* — Marceau Milord
(74) *Attorney, Agent, or Firm* — Sterne, Kessler, Goldstein & Fox P.L.L.C.

(57) ABSTRACT

A method for processing a signal with a corresponding noise profile includes analyzing spectral content of the noise profile, filtering at least one noise harmonic within the signal based on the analyzed spectral content, and limiting the filtered signal. The noise profile may include a phase noise profile. The signal may include a sinusoidal signal and/or a noise signal. At least one filter coefficient that is used to filter the at least one noise harmonic may be determined. The filtering may include low pass filtering. The limiting may include hard-limiting of the filtered signal. A phase difference between the limited signal and a reference signal may be detected.

44 Claims, 13 Drawing Sheets

SYSTEM AND METHOD FOR SIGNAL LIMITING

RELATED APPLICATIONS

The present application is a continuation of application Ser. No. 10/957,043, filed Oct. 1, 2004, which is a continuation-in-part of application Ser. No. 09/634,552, filed Aug. 8, 2000 which claims benefit from and priority to Application No. 60/160,806, filed Oct. 21, 1999; Application No. 60/163,487, filed Nov. 4, 1999; Application No. 60/163,398, filed Nov. 4, 1999; Application No. 60/164,442, filed Nov. 9, 1999; Application No. 60/164,194, filed Nov. 9, 1999; Application No. 60/164,314, filed Nov. 9, 1999; Application No. 60/165,234, filed Nov. 11, 1999; Application No. 60/165,239, filed Nov. 11, 1999; Application No. 60/165,356; filed Nov. 12, 1999; Application No. 60/165,355, filed Nov. 12, 1999; Application No. 60/172,348, filed Dec. 16, 1999; Application No. 60/201,335, filed May 2, 2000; Application No. 60/201,157, filed May 2, 2000; Application No. 60/201,179, filed May 2, 2000; Application No. 60/202,997, filed May 10, 2000; Application No. 60/201,330, filed May 2, 2000. The above referenced applications are hereby incorporated herein by reference in their entirety.

The present application is also a continuation-in-part of U.S. patent application Ser. No. 10/409,213, filed Apr. 3, 2003 and entitled "Phase Locked Loop That Avoids False Locking," the complete subject matter of which is hereby incorporated herein by reference in its entirety.

The present application is related to U.S. patent application Ser. No. 10/813,486, filed Mar. 30, 2004 and entitled "System And Method For Reducing Phase Noise," the complete subject matter of which is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Spectral purity and reduced phase noise are becoming an inseparable requirement of signal generation and amplification circuits. Most modern communication systems, in particular, employ phase-locked loops (PLLs) and frequency synthesizers, along with their associated specified performance. Those specifications normally dictate the performance of individual blocks, including voltage controlled oscillators (VCOs), dividers, etc. Traditionally, the noise and spectral profile of different blocks are included in a linear, phase domain AC-type analysis, or simulation, to estimate the final spectral performance of a PLL. Such analysis, however, ignores the nonlinear effects in the signal generation path, including a limiting action by a limiter, for example.

Limiters may be utilized with an electric circuit to transform a sinusoidal wave into a square wave, for example. Because of the non-linear effect in the signal generation path within the electric circuit and the resulting phase noise profile, as outlined below, a limiting action by a limiter may substantially increase the phase noise profile of the generated signal at the output of the limiter.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Aspects of the present invention may be found in a method and system for processing a signal with a corresponding noise profile. Aspects of the method may comprise analyzing spectral content of the noise profile. At least one noise harmonic within the signal may be filtered based on said analyzed spectral content. The filtered signal may be limited. The noise profile may comprise a phase noise profile. The signal may comprise at least one of a sinusoidal signal and a noise signal. At least one filter coefficient that is used to filter the at least one noise harmonic may be determined. The filtering may comprise low pass filtering and the limiting may comprise hard-limiting the filtered signal. The signal may be modulated prior to the filtering.

The signal may be downconverted prior to the modulating. At least one signal component of the signal may be downconverted. The at least one signal component of the signal may comprise an in-phase signal component and a quadrature signal component. The downconverted signal may be mixed with a local oscillator signal. The mixed signal may be filtered. The filtering may comprise low pass filtering of a sum of a carrier frequency of the signal and a reference frequency of the local oscillator signal. The in-phase signal component and the quadrature signal component may be modulated with a modulation frequency. The modulated in-phase signal component and the modulated quadrature signal component may be added to obtain a downconverted modulated signal. A phase difference may be detected between the limited signal and a reference signal.

Aspects of the system may comprise a processor that analyzes spectral content of the noise profile. A filter may filter at least one noise harmonic within the signal based on the analyzed spectral content. A limiter may limit the filtered signal. The noise profile may comprise a phase noise profile and the signal may comprise at least one of a sinusoidal signal and a noise signal. The processor may determine at least one filter coefficient that is used to filter the at least one noise harmonic. The filter may comprise a low-pass filter and the limiter may comprise a hard-limiter that limits the filtered signal. A modulator may modulate the signal prior to the filtering. A downconverter may downconvert the signal prior to the modulating. More specifically, the downconverter may downconvert at least one signal component of the signal.

The at least one signal component of the signal may comprise an in-phase signal component and a quadrature signal component. A mixer may mix the downconverted signal with a local oscillator signal. A filter may filter the mixed signal. The filter may comprise a low pass filter that filters a sum of a carrier frequency of the signal and a reference frequency of the local oscillator signal. A modulation mixer may modulate the in-phase signal component and the quadrature signal component with a modulation frequency. An adder may add the modulated in-phase signal component and the modulated quadrature signal component to obtain a downconverted modulated signal. A phase detector may detect a phase difference between the limited signal and a reference signal.

These and other features and advantages of the present invention may be appreciated from a review of the following

DETAILED DESCRIPTION OF THE INVENTION

Nonlinear operations within an electric circuit, such as limiting, may cause distortion and aliasing in the signal and noise spectrum. In particular, it may be established for a hard-limiter, for example, that a limiting action by the hard-limiter may cause infinite folding and generation of harmonics at the output of the signal limiter.

In accordance with an aspect of the invention, certain techniques relating to the effect of non-linearity on phase noise profile and signal, which are illustrated below, may be utilized to predict the behavior of an electric signal as it traverses through a circuit comprising a limiter. It may be established that if the limiter gain is not infinite, the close-in phase noise may change depending on how sharp the limiter transitions are. In addition, these derivations may be utilized to predict the spectral properties of a signal within a circuit containing a limiter.

In another aspect of the invention, the phase noise profile of a sinusoidal signal within an electric circuit may be determined, prior to a limiting action by a limiter within the circuit. For example, spectral analysis may be utilized to analyze the spectral content of a noise profile of a given signal. One or more filter coefficients of a filter may then be generated based on the analyzed spectral content. The signal may then be filtered in accordance with the determined filter coefficients so that one or more phase noise characteristics, or perturbations, may be attenuated from the signal. In this way, after the filtered signal passes through a limiter, the infinite folding and generation of noise harmonics at the limiter output may be avoided.

The output of a signal generation circuit, such as a voltage controlled oscillator (VCO), may be represented by:

$$x(t)=A(t)\cos(2\pi f_c t+\phi(t)) \quad (1)$$

For an ideally sinusoidal signal source, A(t) may be equal to a constant $A_0$, and $\phi(t)$ may be constant or equal to zero. If the signal phase varies with time in a sinusoidal fashion, the output of the signal generation circuit may be represented by:

$$x(t)=A_0 \cos(2\pi f_c t+m \sin 2\pi f_m t) \quad (2)$$

Utilizing frequency modulation (FM) theory, expression (2) may be further expanded in terms of modified Bessel functions. In this way, sinusoidal modulation of the phase may result in generation of sidebands at integer multiples of modulation frequency $f_m$ with respect to the center frequency $f_c$. If m is smaller than 1, the following small modulation index approximation may be inferred:

$$x(t) \approx A_0\cos2\pi f_c t + A_0\frac{m}{2}[\cos2\pi(f_c + f_m)t - \cos2\pi(f_c - f_m)t] \quad (3)$$

Figure 1:
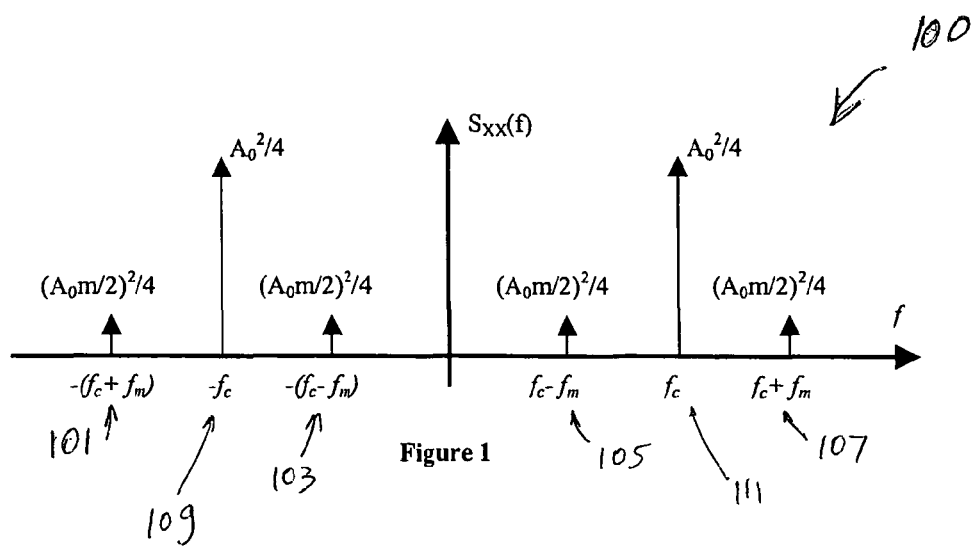
FIG. 1 is a graphical representation of power spectral density (PSD) for a noise-containing sinusoidal signal, in accordance with an embodiment of the invention.

FIG. 1 is a graphical representation 100 of power spectral density (PSD) for a noise-containing sinusoidal signal, in accordance with an embodiment of the invention. PSD may be undefined for a deterministic signal. However, a deterministic signal may be assumed to contain a small and negligible random process, such as noise. In this case, the PSD may be well defined. Referring to FIG. 1, the random noise may be reflected in frequency domain at frequencies 101, 103, 105, and 107, disposed around the mirror center frequency $-f_c$ 109 and $f_c$ 111.

Figure 2:
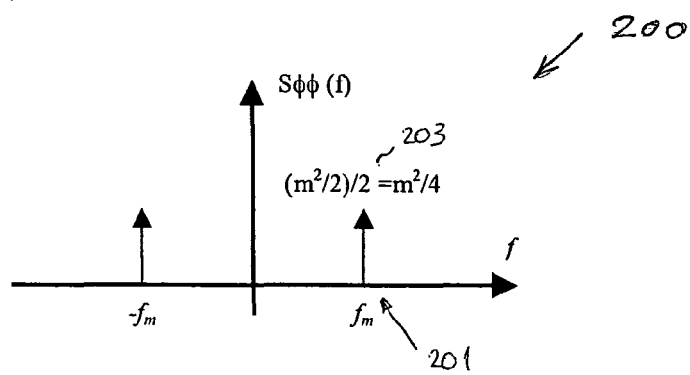
FIG. 2 is a graphical representation of the modulating phase of the sinusoidal signal of FIG. 1, in accordance with an embodiment of the invention.

FIG. 2 is a graphical representation 200 of the modulating phase of the sinusoidal signal of FIG. 1, in accordance with an embodiment of the invention. Referring to FIG. 2, there is illustrated a PSD 203 of a modulating phase $f_m$ 201. In the signal PSD, the phase PSD may be replicated around a carrier frequency $f_c$.

In a more general case:

$$x(t)=(A_0+a(t))\cdot\cos(2\pi f_c t+m\sin 2\pi f_m t) \quad (4)$$

Through the small modulation index approximation and the assumption that $a(t)\ll A_0$, equation (4) may be simplified to:

$$x(t) \approx \quad (5)$$

$$A_0\cos2\pi f_c t + a(t)\cos2\pi f_c t + A_0\frac{m}{2}[\cos2\pi(f_c + f_m)t - \cos2\pi(f_c - f_m)t]$$

In particular, for $a(t)=a_0\cos 2\pi f_m t$:

$$x(t) = A_0\cos2\pi f_c t + \quad (6)$$

$$\left(\frac{a_0}{2} + A_0\frac{m}{2}\right)\cos2\pi(f_c + f_m)t + \left(\frac{a_0}{2} - A_0\frac{m}{2}\right)\cos2\pi(f_c - f_m)t$$

The sidebands created at the modulation frequency $f_m$ may be caused by amplitude modulation (AM) and/or phase modulation (PM). For small variations, AM and PM may be indistinguishable.

Figure 3:
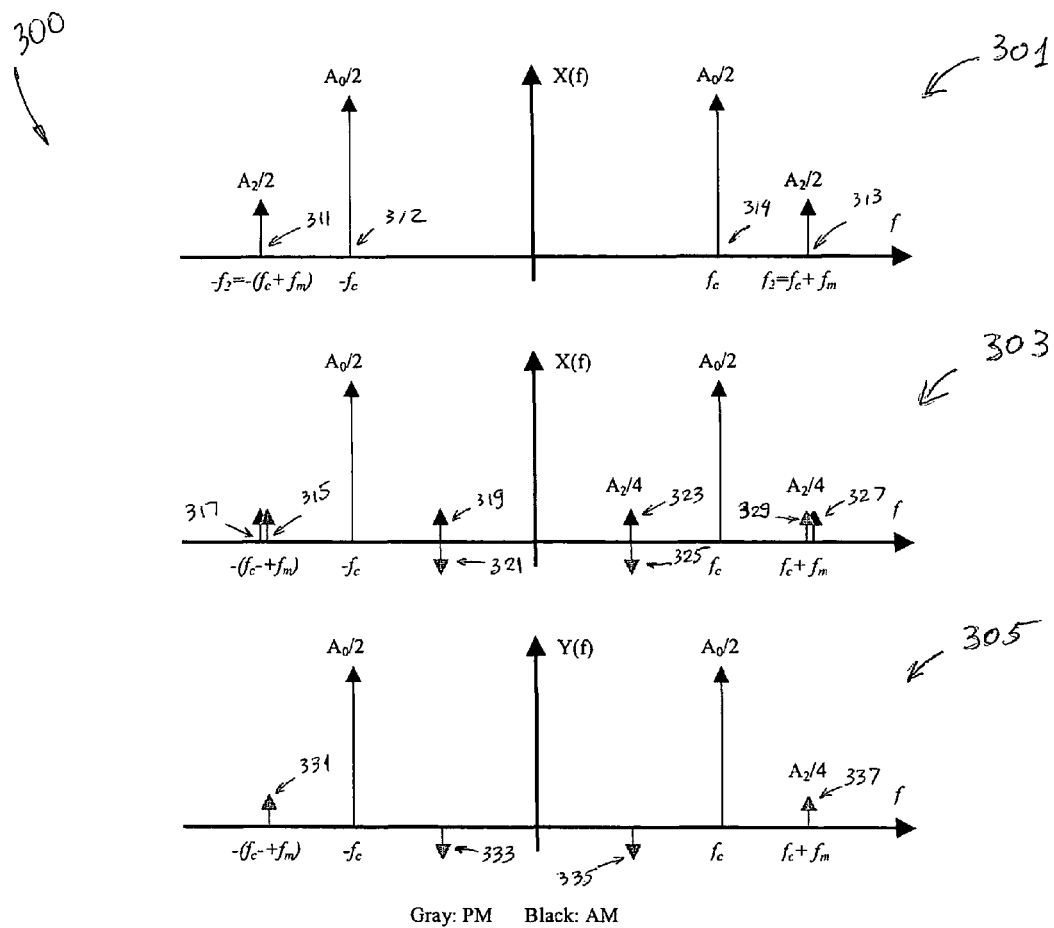
FIG. 3 is a graphical representation of phase modulation and amplitude modulation of a sinusoidal signal passed through a limiter, in accordance with an embodiment of the invention.

FIG. 3 is a graphical representation 300 of phase modulation and amplitude modulation of a sinusoidal signal passed through a limiter, in accordance with an embodiment of the invention. If a large sinusoidal wave is accompanied by a small one, it may be determined:

$$x(t)=A_0\cos 2\pi f_c t+A_2\cos 2\pi f_2 t \; A_0\gg A_2 \quad (7)$$

Equation (7) may be rearranged to yield:

$$x(t) = A_0\cos2\pi f_c t + \left(\frac{A_2}{2} + A_0\frac{A_2}{2A_0}\right) \quad (8)$$

$$\cos[2\pi(f_c + (f_2 - f_c)]t + \left(\frac{A_2}{2} - A_0\frac{A_2}{2A_0}\right)\cos[2\pi(f_c - (f_2 - f_c)]t$$

Utilizing equation (6), equation (8) may be represented as a sinusoidal wave with amplitude and phase modulation:

$$x(t) = (A_0 + a_0\cos2\pi f_m t)\cdot\cos(2\pi f_c t + m\sin2\pi f_m t), \quad (9)$$

$$a_0 = A_2, \; m = \frac{A_2}{A_0}, \; f_m = f_2 - f_c$$

If the amplitude modulation is suppressed, for example by passing the signal through a circuit, such as a limiter, which reacts to zero crossings, for example, the result may be a sinusoidal wave with phase modulation only. In this way, the passing of the signal through a circuit may result in two side bands:

$$y(t) = A_0\cos2\pi f_c t + \frac{A_2}{2}\cos2\pi(f_c + f_m)t - \frac{A_2}{2}\cos2\pi(f_c - f_m)t \quad (10)$$

Referring to FIG. 3, graphical representation 301 may illustrate a limiter input signal X(f) in frequency domain. The signal X(f) may comprise a carrier signal at a center frequency $f_c$ 314 and smaller sinusoidal signal at frequency $f_2$ 313. The mirror images of the center frequency $f_c$ and the sinusoidal signal at frequency $f_2$ may be located at frequencies $-f_c$ 312 and $-f_2$ 311.

The graphical representation 303 may illustrate decomposition of the small sinusoid within the signal X(f) into AM and PM components. For example, the small sinusoid at frequency $f_2$ 313 may be decomposed into AM components at frequencies 323 and 327, and PM components at frequencies 325 and 329. Similarly, the mirror image $-f_2$ 311 may be decomposed into AM components at frequencies 317 and 319, and PM components at frequencies 315 and 321.

The graphical representation 305 may represent, for example, AM to PM conversion within an exemplary output signal Y(f) of a limiter when an input signal X(f) is applied to it. As a result, the AM sidebands may be suppressed and two PM sidebands, at frequencies 335 and 337, may remain. PM sidebands 331 and 333 may correspond to sidebands 337 and 335, respectively.

Figure 4:
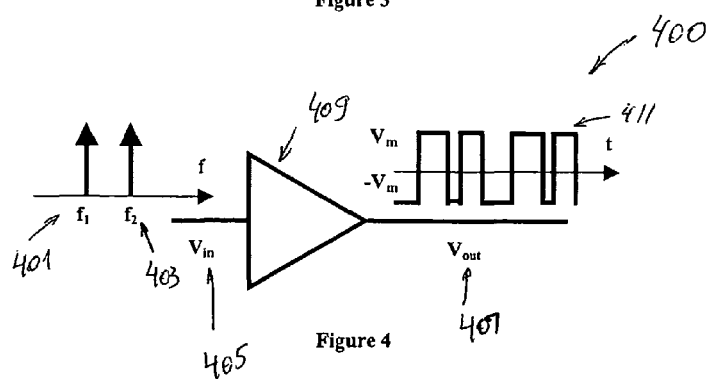
FIG. 4 is a schematic block diagram of a limiter, in accordance with an embodiment of the invention.

In order to obtain the spectrum at the output of a limiter in terms of its input, a limiter may be considered as a high-gain amplifier. FIG. 4 is a schematic block diagram 400 of a limiter, in accordance with an embodiment of the invention. Referring to FIG. 4, the limiter 409 may limit an input signal 405 to generate an output signal 407. The input signal 405 may comprise two sinusoidal signals 401 and 403 with equal amplitudes. The limiter output 407 may be represented by the timing diagram 411. In this way, the limiter output 407 may switch between a negative and a positive level, $-V_m$ and $V_m$ respectively, depending on weather the input is smaller or larger than zero. The input to the limiter may be represented by:

$$V_{in}(t)=A\sin(2\pi f_1 t)+A\sin(2\pi f_2 t+\theta) \quad (11)$$

Since the limiter 409 may only respond to the zero crossings of $V_{in}$, the amplitude A is irrelevant and only the relative amplitude of the two sinusoidal waves 401 and 403 may be considered. Zero crossings occur at $V_{in}=0$:

$$\sin(2\pi f_1 t)=\sin(-2\pi f_2 t-\theta) \quad (12)$$

Two sets of answers satisfy this condition.

$$\begin{cases} 2\pi f_1 t = -2\pi f_2 t - \theta + 2k\pi \\ 2\pi f_1 t = \pi + 2\pi f_2 t + \theta + 2k\pi \end{cases} \rightarrow \begin{cases} 2\pi(f_1 + f_2)t = 2k\pi - \theta \\ 2\pi(f_1 - f_2)t = 2k\pi + \pi + \theta \end{cases} \quad (13)$$

Therefore, the times at which zero crossing may happen are:

$$\begin{cases} t = \frac{1}{f_1 + f_2}\left(k - \frac{\theta}{2\pi}\right) = \frac{1}{f_+}\left(k - \frac{\theta}{2\pi}\right) \\ t = \frac{1}{f_1 - f_2}\left(k + \frac{\theta + \pi}{2\pi}\right) = \frac{1}{f_-}\left(k + \frac{\theta + \pi}{2\pi}\right) \end{cases} \quad (14)$$

This means that the output crosses zero at any of these times. The output may be considered as a product of two square waves, one with a frequency of $f_-/2$, and the other with a frequency of $f_+/2$, each representing one of the two sets of solutions:

$$V_{out}(t) = V_m \times (V_{out+}(t) \times V_{out-}(t)) \quad (15)$$

In frequency domain:

$$V_{out}(f) = V_m \times (V_{out+}(f) * V_{out-}(f)) \quad (16)$$

In the above equation (16), "*" denotes convolution.

Figure 5:
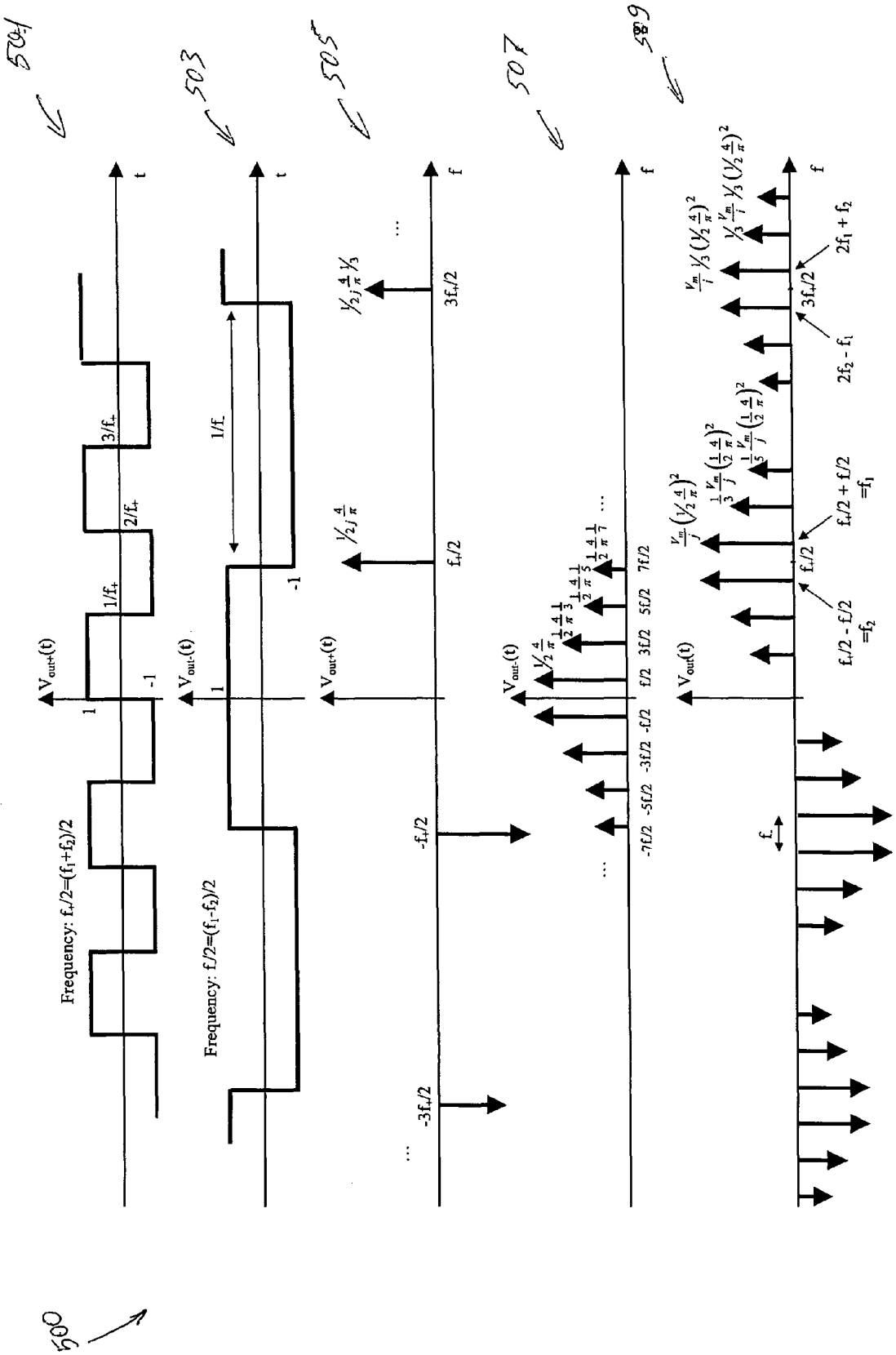
FIG. 5 is a graphical representation of output voltage components and output voltage of the limiter in FIG. 4, in accordance with an embodiment of the invention.

FIG. 5 is a graphical representation 500 of output voltage components and output voltage of the limiter in FIG. 4, in accordance with an embodiment of the invention. Referring to FIG. 5, for the case of θ=0, the output voltage components $V_{out+}$ and $V_{out-}$ may be represented by the graphical representations 501 and 503, respectively. The output voltage components $V_{out+}$ and $V_{out-}$ in frequency domain may be represented by the graphical representations 505 and 507, respectively. The total output voltage component $V_{out}$ may be represented in frequency domain by the graphical representation 509.

Convolution of each impulse in the $V_{out+}$ spectrum with $V_{out-}$ may create a replica of the entire $V_{out-}$ spectrum around that impulse. Thus, the general shape of the spectrum of $V_{out}$ is a set of replicas of $V_{out-}$ spectrum, spaced by odd multiples of $f_+/2=(f_1+f_2)/2$. The overlap of the replicas may or may not be substantial depending on the relative difference between $f_1$ and $f_2$. The overlap is not shown here for clarity. The spectrum may scale linearly with $V_m$. In addition, there may be smaller impulses repeated at multiples of $f_-$ from the two impulses at $f_1$ and $f_2$. A similar pattern may occur at $3f_+/2$, $5f_+/2$, etc. It may be noticed from the graphical representation 500 that of the total output power of $V_m^2$, approximately one third may go into each of the two fundamental frequencies $f_1$ and $f_2$. In one aspect of the invention, the above convolution equation for obtaining $V_{out}$ may be utilized to predict phase noise harmonics, for example, within a sinusoidal signal with a phase noise profile.

Figure 6:
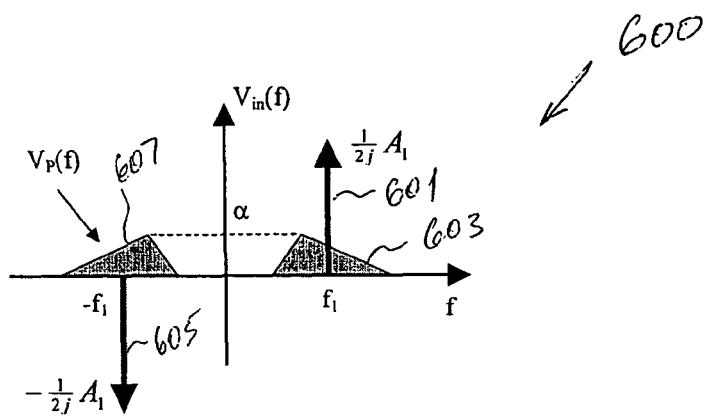
FIG. 6 is a graphical representation of noise profile and voltage for an input signal of the limiter in FIG. 4, in accordance with an embodiment of the invention.

FIG. 6 is a graphical representation 600 of noise profile and voltage for an input signal of the limiter in FIG. 4, in accordance with an embodiment of the invention. Referring to FIG. 6, an input signal $V_{in}$ may comprise a large signal 601, or a carrier, with a mirror image 605, and a small signal 603 with a mirror image 607. The small signal 603 may comprise a small sinusoidal wave:

$$V_{in}(t) = A_1 \sin(2\pi f_1 t) + A_2 \sin(2\pi f_2 t + \theta) \quad (17)$$

The small sinusoid 603 may be regarded as noise, which may be represented by $V_P(t)$:

$$V_{in} = A_1 \sin(2\pi f_1 t) + V_P(t) \quad (18)$$

Figure 7:
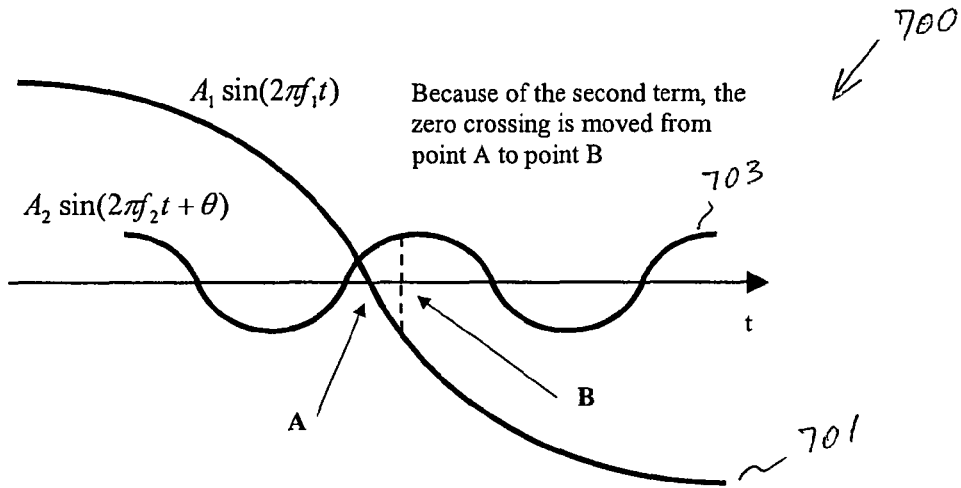
FIG. 7 is a graphical representation of a large sinusoidal signal and a small sinusoidal signal applied to a limiter, in accordance with an embodiment of the invention.

FIG. 7 is a graphical representation of a large sinusoid signal and a small sinusoidal signal applied to a limiter, in accordance with an embodiment of the invention. Referring to FIG. 7, the large sinusoidal signal 701 may have a zero crossing at point A. The perturbation 703 may move the zero crossing of the sinusoidal signal 701 from point A to point B. In order to obtain the spectrum of the output of a limiter, the limiter may be approximated as a high gain amplifier that saturates at the positive and negative supply levels, or as a soft limiter.

Figure 8:
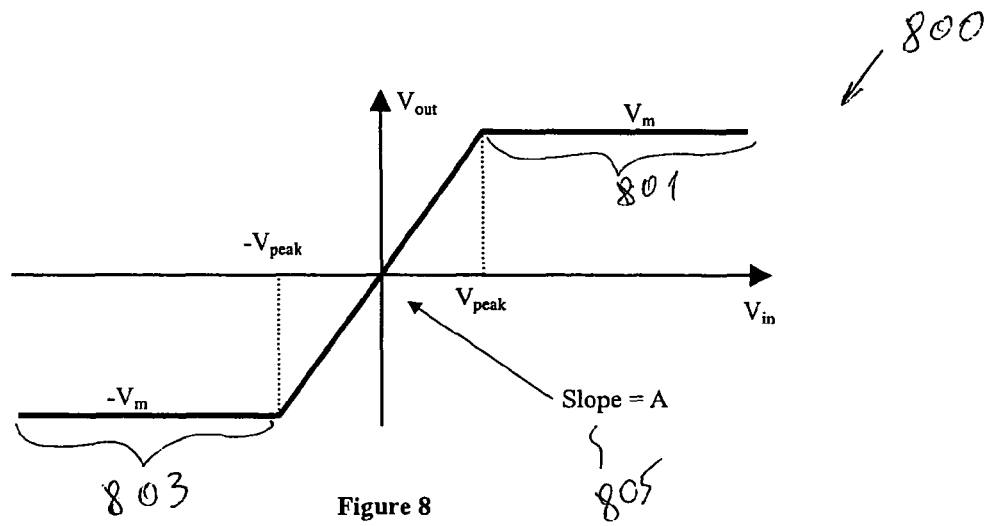
FIG. 8 is a graphical representation of a soft limiter, in accordance with an embodiment of the invention.

FIG. 8 is a graphical representation 800 of a soft limiter, in accordance with an embodiment of the invention. If a pure sinusoidal wave were applied to the high gain amplifier, the output may be approximated to a square wave, with flat sections 801 and 803. During transitions, the output would be an amplified version of the input, with a gain of A, which is the slope 805.

Figure 9:
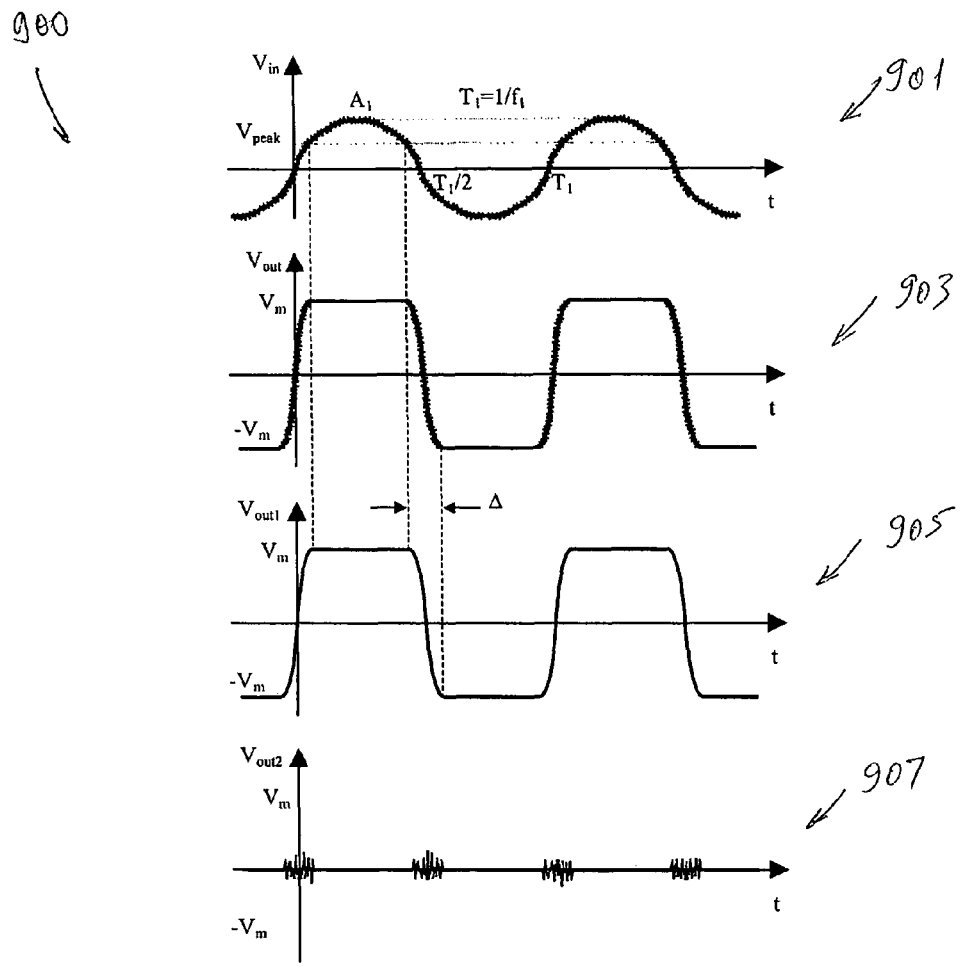
FIG. 9 is a graphical representation of output voltage for the limiter in FIG. 8, in accordance with an embodiment of the invention.

FIG. 9 is a graphical representation 900 of output voltage for the limiter in FIG. 8, in accordance with an embodiment of the invention. Referring to FIG. 9, graphical representation 901 illustrates the input signal, which may comprise a sinusoidal wave plus a small perturbation. The output signal $V_{out}$ may be illustrated by the graphical representation 903. The output signal $V_{out}$ may be decomposed into components $V_{out1}$ and $V_{out2}$, such that $V_{out}=V_{out1}+V_{out2}$, as illustrated on graphical representation 900. The transition time Δ may be obtained from:

$$A_1 \sin\left(2\pi f_1 \frac{\Delta}{2}\right) \cdot A = V_m \quad (19)$$

$$\Delta = \frac{1}{\pi f_1} \sin^{-1}\left(\frac{V_m}{AA_1}\right) \quad (20)$$

For small Δ, or for $$\Delta \ll \frac{1}{\pi f_1}:$$

$$\Delta \approx \frac{1}{\pi f_1} \cdot \frac{V_m}{AA_1} \quad (21)$$

$V_{out2}$ may be represented by the graph 907 as a chopped version of the small input perturbation, multiplied by A.

Figure 10:
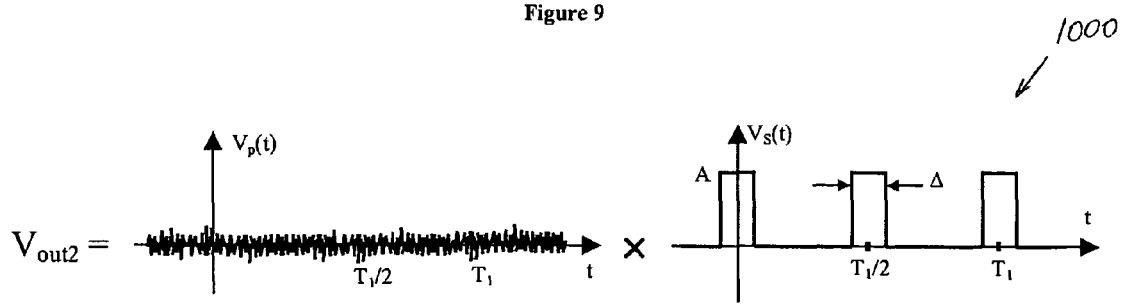
FIG. 10 is a graphical representation of a noise component for the output voltage of FIG. 9, in accordance with an embodiment of the invention.

FIG. 10 is a graphical representation 1000 of a noise component for the output voltage of FIG. 9, in accordance with an embodiment of the invention. Referring to FIG. 10, the output voltage component $V_{out2}$ may be further decomposed into the product of $V_P(t)$ and a sampling function $V_S(t)$. Therefore, the output voltage may be presented as:

$$V_{out}(t) = V_{out1}(t) + V_{out2}(t) = V_{out1}(t) + V_P(t) \times V_S(t) \quad (22)$$

$$V_{out}(f) = V_{out1}(f) + V_P(f) * V_S(f) \quad (23)$$

Figure 11:
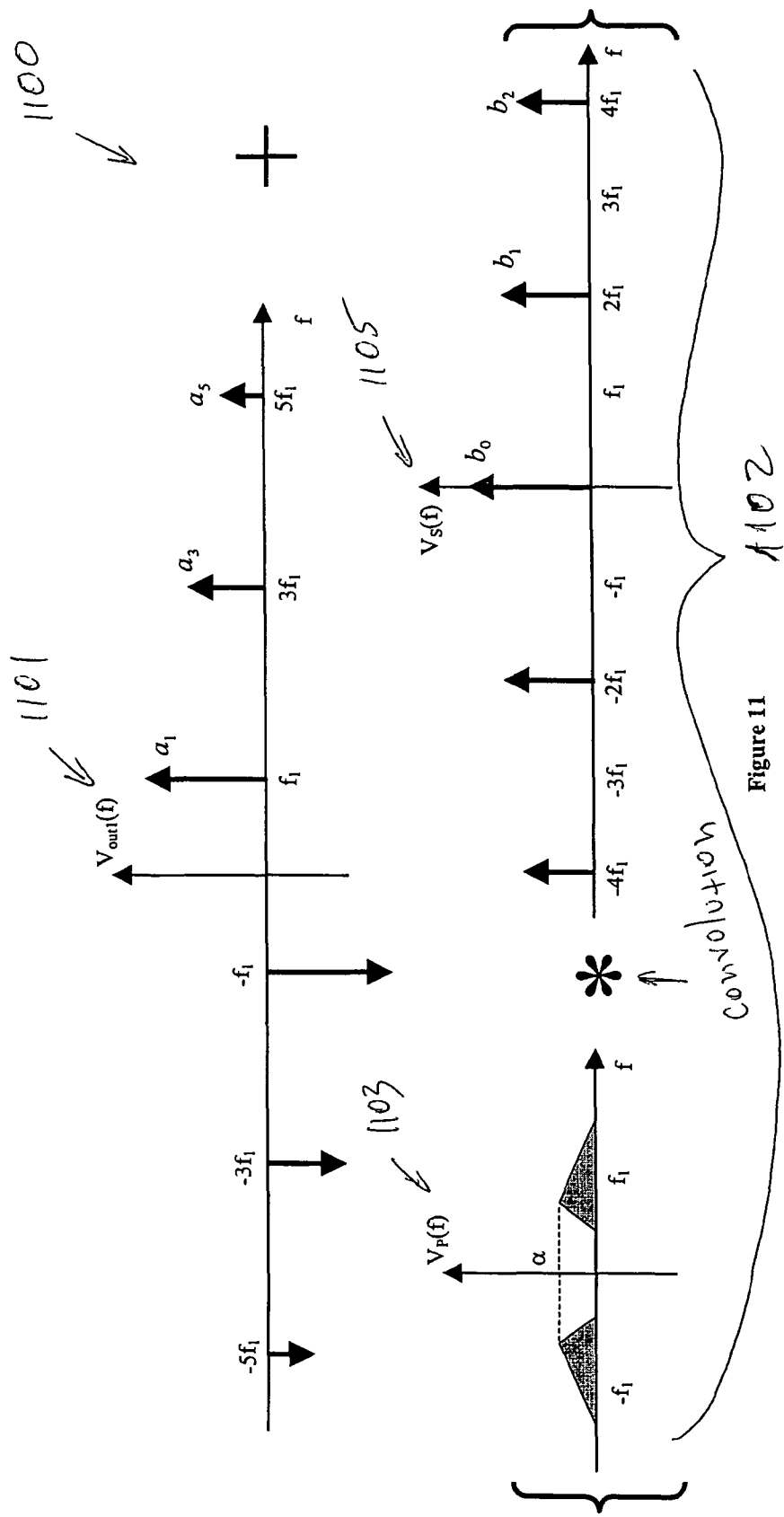
FIG. 11 is a graphical representation in frequency domain of the output voltage of FIG. 9, in accordance with an embodiment of the invention.

FIG. 11 is a graphical representation 1100 in frequency domain of the output voltage of FIG. 9, in accordance with an embodiment of the invention. Referring to FIG. 11, the output voltage $V_{out}$ may be represented as the sum of two components—1101 and 1102. The first component 1101 may be represented by a periodic signal with the fundamental frequency of $f=f_1$. This signal may represent what the output would look like in the absence of any small perturbation at the input. A Fourier transform of this signal may comprise impulses at odd harmonics of $f_1$. The second component 1102 may be a sampled version of the small perturbation, at a sampling frequency equal to $2f_1$.

In this way, the output spectrum may be broken down as follows:

$$V_{out1}(f) = \sum_{k=-\infty}^{\infty} a_k \delta(f - kf_1) \tag{24}$$

$$a_k = \begin{cases} 0 & \text{if } k = \text{even} \\ \frac{1}{2j} \cdot \left(2f_1 A A_1 \left(\Delta - \frac{\sin(2\pi f_1 \Delta)}{2\pi f_1}\right) + \frac{4V_m}{\pi} \cos(\pi f_1 \Delta)\right) & \text{if } k = 1 \\ \frac{1}{2j} \cdot \left(2f_1 A A_1 \left(\frac{\sin((k-1)\pi f_1 \Delta)}{(k-1)\pi f_1} - \frac{\sin((k+1)\pi f_1 \Delta)}{(k+1)\pi f_1}\right) + \frac{4V_m}{\pi k} \cos(k\pi f_1 \Delta)\right) & \text{otherwise} \end{cases} \tag{25}$$

For a small $\Delta$, equation 125 may be simplified to:

$$a_k = \frac{1}{2j} \cdot \frac{1}{k} \cdot \frac{4V_m}{\pi} \quad (\text{odd } k) \tag{26}$$

Equation (26) may be a very close approximation as a $a_k(\Delta)$ is flat around $\Delta=0$, when $$\left. \frac{\partial a_k}{\partial \Delta} \right|_{\Delta=0} = 0.$$

Similarly, $$V_S(f) = \sum_{k=-\infty}^{\infty} b_k \delta(f - k(2f_1)) \tag{27}$$

$$b_0 = 2A f_1 \Delta \text{ and } b_k = \frac{A}{k\pi} \sin(2k\pi f_1 \Delta) \quad (k > 0) \tag{28}$$

As the limiter becomes more ideal and $A \to \infty$ and $\Delta \to 0$, $V_S(t)$ may turn into an impulse train, for which:

$$b_k \approx \frac{A}{k\pi} 2k\pi f_1 \Delta = 2A f_1 \Delta \tag{29}$$

For a small $\Delta$:

$$b_k \approx 2A f_1 \cdot \frac{1}{\pi f_1} \cdot \frac{V_m}{AA_1} = \frac{2V_m}{\pi A_1} \tag{30}$$

Figure 12:
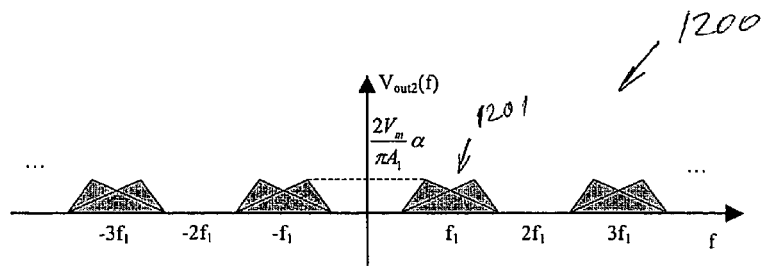
FIG. 12 is a graphical representation of perturbation spectrum of output voltage component of the output voltage of FIG. 9, in accordance with an embodiment of the invention.

FIG. 12 is a graphical representation 1200 of perturbation spectrum of output voltage component of the output voltage of FIG. 9, in accordance with an embodiment of the invention. Referring to FIG. 12, the output voltage component $V_{out2}(f)$ may comprise replicas of the input small perturbation spectrum 1201 repeated every $2f_1$. The replicas may be scaled by $2V_m/(\pi A_1)$, and they may also be folded onto each other. The output voltage may be presented as:

$$V_{out}(f) = \sum_{k=odd} a_k \delta(f - kf_1) + V_P(f) * \sum_{k=-\infty}^{\infty} b_k \delta(f - k(2f_1)) \tag{31}$$

-continued $$V_{out}(f) = \sum_{k=odd} a_k \delta(f - kf_1) + \sum_{k=-\infty}^{\infty} b_k V_P(f - k(2f_1)) \tag{32}$$

Figure 13:
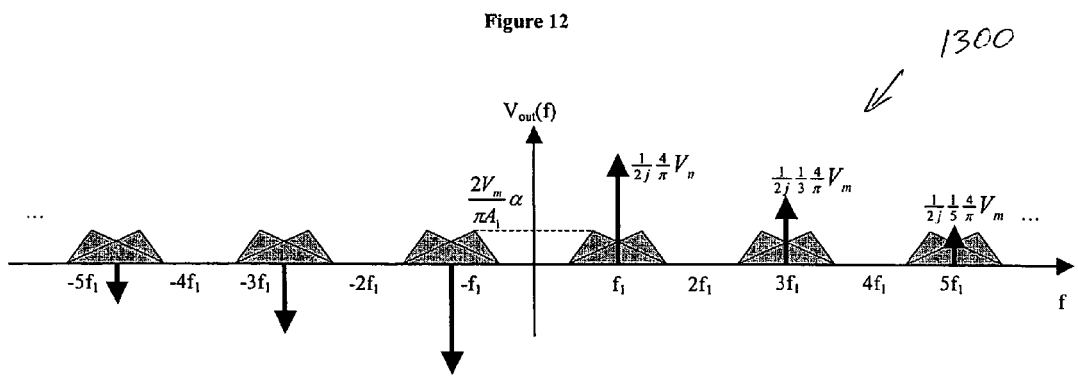
FIG. 13 is a graphical representation in frequency domain of output voltage from a limiter with a single side band perturbation in the input signal, in accordance with an embodiment of the invention.

FIG. 13 is a graphical representation 1300 in frequency domain of output voltage from a limiter with a single side band perturbation in the input signal, in accordance with an embodiment of the invention. Referring to FIG. 13, the output voltage may be represented by:

$$V_{out}(f) = \sum_{k=odd} \frac{4V_m}{2jk\pi} \delta(f - kf_1) + \frac{2V_m}{\pi A_1} \sum_{k=-\infty}^{\infty} V_P(f - k(2f_1)) \tag{33}$$

With regard to passing a signal with phase noise profile through a limiter, the output of the limiter may be represented as the sum of two components. The first part may comprise a square wave at $f=f_1$, which is what the output spectrum would be in the absence of any small perturbation. The second part may comprise a sampled version of the small perturbation, at a sampling frequency equal to $2f_1$. Because of the sampling action, the mirrored spectrum of the perturbation may fold on top of itself, around the odd multiples of the carrier frequency.

In this way, a single sideband perturbation (SSB) may occupy only one single sideband of the carrier as there is energy only on one side of the carrier and its total bandwidth is smaller than $f_1$. Consequently, if the carrier to SSB ratio at the input is:

$$R_{input} = \frac{A_1/2}{\alpha}, \tag{34}$$

then at the output, the ratio of carrier to each SSB becomes:

$$R_{output} = \frac{\frac{V_m}{2\pi}}{\frac{2V_m}{\pi A_1} \alpha} = 2 R_{input}, \tag{35}$$

as illustrated on FIG. 13. Therefore, the carrier to each sideband ratio may be reduced but with a resulting increase in the sidebands.

Figure 14:
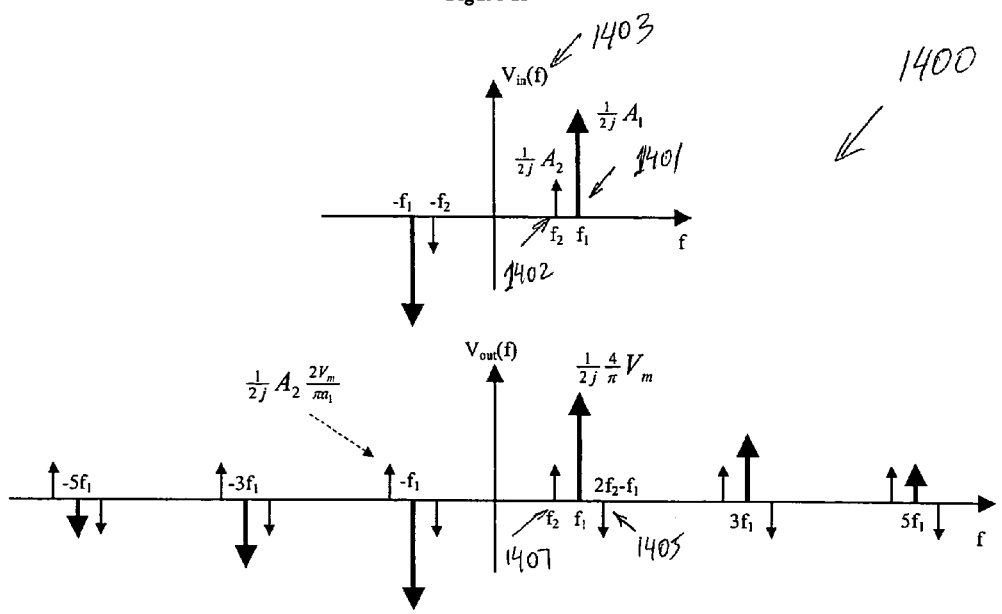
FIG. 14 is a graphical representation in frequency domain of input and output voltage from a limiter with a single side band perturbation in a sinusoid input signal, in accordance with an embodiment of the invention.

FIG. 14 is a graphical representation 1400 in frequency domain of input and output voltage from a limiter with a single side band perturbation in a sinusoid input signal, in accordance with an embodiment of the invention. Referring to FIG. 14, the input signal 1403 may comprise a sum of one large sinusoidal wave 1401 and one small sinusoidal wave 1402. At the input, the carrier frequency may be at $f=f_1$, the single sideband may be at $f=f_2$, and the carrier to sideband ratio may be $A_1/A_2$. At the output, the sideband 1402 may be split into two smaller sidebands 1407, at $f=f_2$, and 1405, at $f=2f_2-f_1$. The carrier to sideband ratio for each sideband may be $(A_1/A_2)/2$. In this way, the additive AM may be converted into PM sidebands, as indicated earlier. Analytical expressions may be derived if A is not large, using the formulas for $a_n$ and $b_n$ coefficients in $V_{out1}(f)$ and $V_S(f)$.

Figure 15:
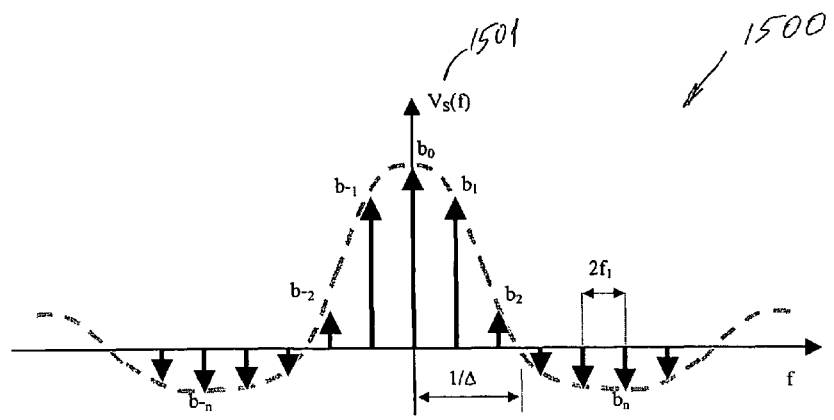
FIG. 15 is a graphical representation in frequency domain of a sampling function component within output voltage from a limiter, in accordance with an embodiment of the invention.

FIG. 15 is a graphical representation 1500 in frequency domain of a sampling function component within output voltage from a limiter, in accordance with an embodiment of the invention. Referring to FIG. 15, if A is finite and, therefore, Δ is non-zero, the sampling signal $V_S(t)$ 1501 may comprise a series of diminishing impulses in frequency domain with a sinc-shape envelope. The impulses may be spaced by $2f_1$ and the sinc zeros may be at multiples of $1/\Delta$. If the zeros of the sinc coincide with the impulses, when $2f_1=1/\Delta$ and $\Delta=T_1/2$, then $V_S(f)$ may be reduced to a single impulse of magnitude A at $f=0$. Under these conditions, $V_{out1}=0$. The output voltage may then be presented as:

$$V_{out}(f) = 0 + V_{in}(f) * V_x(f) = A \cdot V_{in}(f) \quad (36)$$

Such result may be expected since when $\Delta = T_1/2$, the input waveform may be small, so that the limiter may not saturate and may be always in its linear regime. Therefore, the signal may be amplified with a gain of A.

Figure 16:
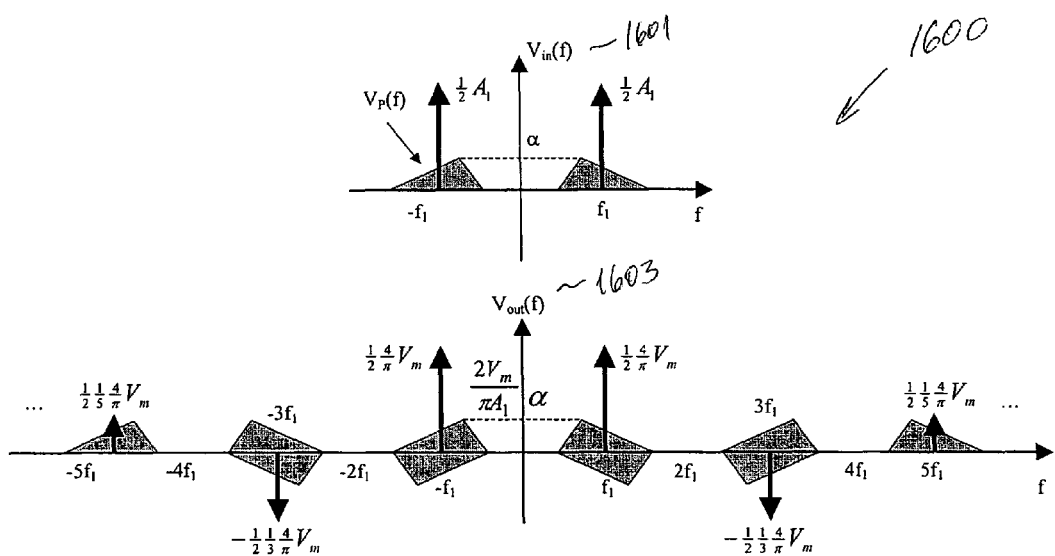
FIG. 16 is a graphical representation in frequency domain of input and output voltage from a limiter with a single side band perturbation in a cosine input signal, in accordance with an embodiment of the invention.

FIG. 16 is a graphical representation 1600 in frequency domain of input and output voltage from a limiter with a single side band perturbation in a cosine input signal, in accordance with an embodiment of the invention. Referring to FIG. 16, the input signal 1601 may comprise a cosine input signal with a single side band perturbation.

Figure 17:
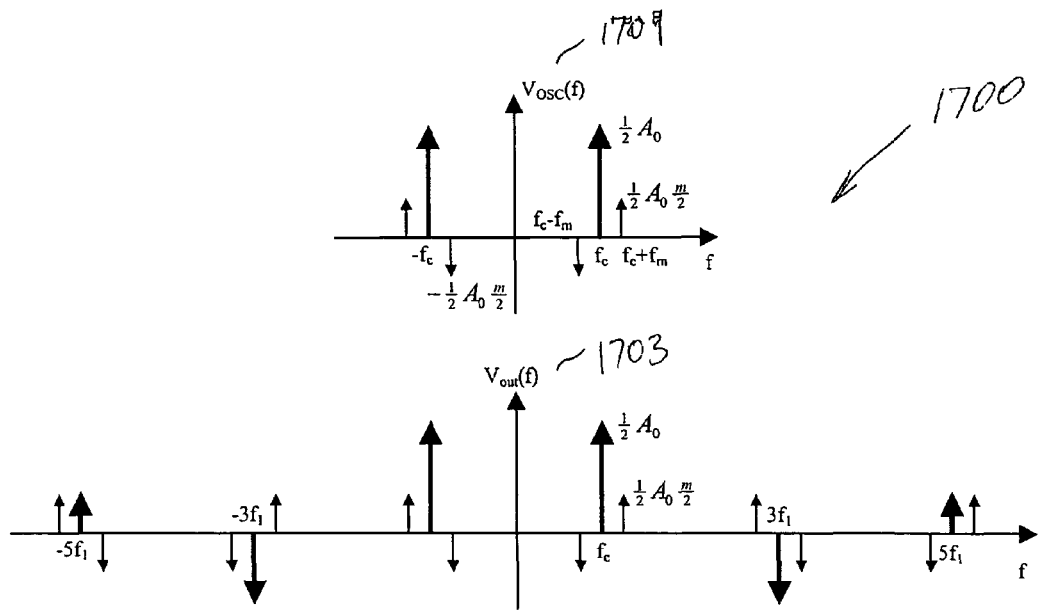
FIG. 17 is a graphical representation in frequency domain of oscillation input with PM and output voltage from a limiter, in accordance with an embodiment of the invention.

FIG. 17 is a graphical representation in frequency domain of oscillation input with PM and output voltage from a limiter, in accordance with an embodiment of the invention. Referring to FIG. 17, the input signal $V_{OSC}$ 1701 may comprise an oscillation with a small PM modulation in cosine form, and may be represented by:

$$V_{OSC}(t) = A_0 \cos(2\pi f_c t + m \sin 2\pi f_m t) \quad (37)$$

$$V_{OSC}(t) \approx A_0 \cos 2\pi f_c t + A_0 \frac{m}{2} [\cos 2\pi (f_c + f_m) t - \cos 2\pi (f_c - f_m) t] \quad (38)$$

The output signal $V_{out}$ 1703 may be obtained by utilizing the information in FIG. 16. For simplicity, it may be assumed, for example, that $4V_m/\pi = A_0$, or the gain for the cosine wave at $f_c$ is equal to 1.

Figure 18:
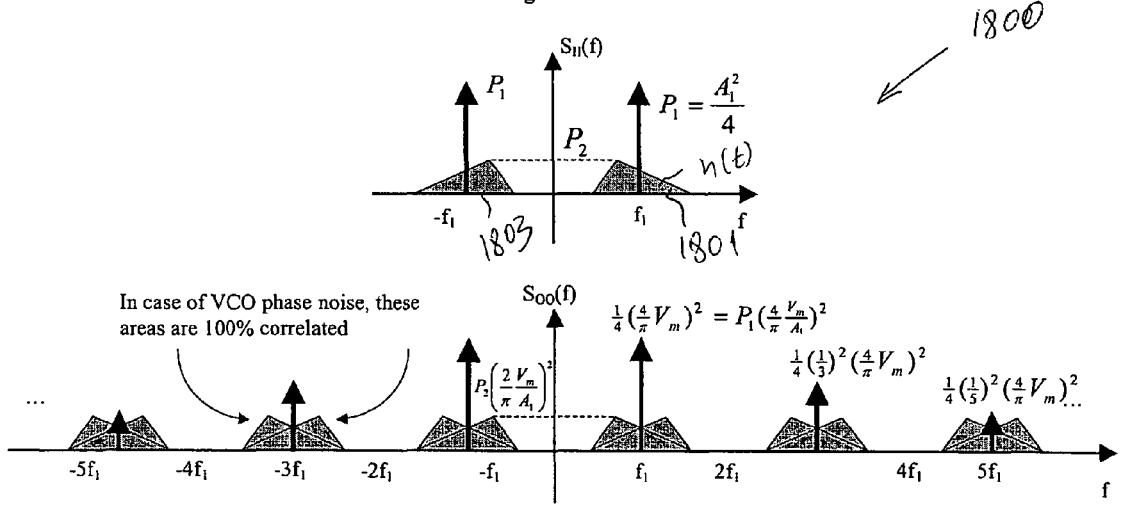
FIG. 18 is a graphical representation in frequency domain of power spectral density of a limiter input of a large sinusoid with a random process and a limiter output, in accordance with an embodiment of the invention.

FIG. 18 is a graphical representation 1800 in frequency domain of power spectral density of a limiter input of a large sinusoid with a random process and a limiter output, in accordance with an embodiment of the invention. Referring to FIG. 18, the random process n(t) 1801 may be represented as noise, for example, with relatively small amplitude and a given power spectral density $S_{nn}(t)$. The PSD of the small perturbation 1801 and its mirrored version 1803 may be repeated around odd multiples of the carrier. The parts of the PSD that fold on top of each other may not be randomly added up. In case of a Fourier transform of deterministic signals, when adding two spectrums, the phase information may correctly sum the amplitudes. Similarly, to correctly add power spectral densities, information regarding their correlation may be utilized. If two random processes x(t) and y(t) are added to form a random process z(t), the resulting PSD may be represented by:

$$S_{ZZ}(f) = F(R_{ZZ}(\tau)) = F(E[z(t) \cdot z(t+\tau)]) \quad (39)$$

$$S_{ZZ}(f) = F(E[(x(t)+y(t)) \cdot (x(t+\tau)+y(t+\tau))]) \quad (40)$$

$$S_{ZZ}(f) = F(E[(x(t)x(t+\tau)] + E[y(t)y(t+\tau)] + E[(x(t)y(t+\tau)] + E[x(t+\tau)y(t)]) \quad (41)$$

If the two processes x(t) and y(t) are uncorrelated, the last two terms in the Fourier transform may be reduced to zero:

$$S_{ZZ}(f) = F(E[(x(t)x(t+\tau)]) + F(E[y(t)y(t+\tau)]) \quad (42)$$

$$S_{ZZ}(f) = S_{XX}(f) + S_{YY}(f) \quad (43)$$

If the signals are correlated, the above equation may not hold. In particular, if $y(t) = \alpha x(t)$, then:

$$S_{ZZ}(f) = (1+\alpha)^2 S_{XX}(f) \quad (44)$$

If two areas of the power spectrum which are 100% correlated, or their underlying random processes are the same and act in the same direction, fold onto each other, the resulting PSD may not double, but may quadruple, according to the above formula.

If a large sinusoidal wave is accompanied by wideband thermal noise, according to FIG. 18, the thermal noise may fold on top of itself for every convolution with the impulses in the sampling function. If the thermal noise is not bandlimited, it may fold on itself an infinite number of times. Since the areas that fold on each other are uncorrelated, the PSDs may add up directly and subsequently the result may become infinite.

Thermal noise, however, is mostly bandlimited. Thus, in the process of hard-limiting, the noise may fold onto itself only a limited number of times. A limiter, therefore, may increase the thermal noise level if it has a relatively wide band. It may be shown that if a large sinusoidal wave accompanied by a bandlimited thermal noise is passed through a limiter, the output PSD of noise on the left side, from $f=0$ to $f=f_c$, and the right side, from $f=f_c$ to $f=2f_c$, of the carrier may be correlated.

Figure 19:
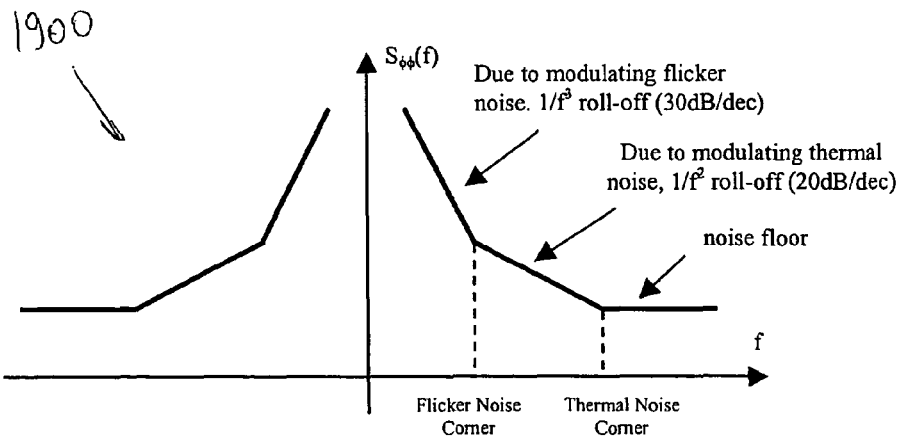
FIG. 19 is a graphical representation of power spectral density of phase noise of a voltage controlled oscillator, in accordance with an embodiment of the invention.

FIG. 19 is a graphical representation 1900 of power spectral density of phase noise of a voltage controlled oscillator, in accordance with an embodiment of the invention. The output signal in a typical integrated VCO may be represented by:

$$x(t) = A \cos(2\pi f_1 t + \phi(t)) \quad (45)$$

Where the term φ(t) may reflect the phase variation due to the noise sources in the VCO. Referring to FIG. 19, there is illustrated the power spectral density of phase noise $S_{\phi\phi}(f)$. A VCO by definition is a phase integrator and, therefore, the power spectral density of the VCO output phase, in terms of the input modulating process, may be represented by:

$$S_{\phi\phi}(f) = \frac{K_V^2}{f^2} S_{II}(f), \quad (46)$$

where $K_V$ may be the VCO constant. If the modulating noise mechanism is a combination of thermal and flicker noise, for $f > 0$, $S_{II}(f)$ may be written as:

$$S_H(f) = \frac{A}{f} + N_{Th1} \quad (47)$$

Therefore, the output phase noise only due to $S_H(f)$ may equal:

$$S_{\phi\phi}(f) = \frac{K_V^2 A_f}{f^3} + \frac{K_V^2 N_{Th1}}{f^2} \quad (48)$$

If it were only due to the modulating mechanisms, the noise profile of the output would be indefinitely descending. However, there may be thermal noise sources that may not modulate the VCO, but may directly appear at the output. An example of such a noise source may be the thermal noise of the series resistance of the inductor in an integrated VCO. This may not be noise in the phase but rather an additive amplitude noise. However, the phase and amplitude noises may appear similarly in a PSD measurement on a spectrum analyzer. Therefore, for f>0 a term may be added to the PSD to account for the thermal noise floor:

$$S_{\phi\phi}(f) = \frac{K_V^2 A_f}{f^3} + \frac{K_V^2 N_{Th1}}{f^2} + N_{Th2} \quad (49)$$

Even though the AM and PM components may be indistinguishable in a PSD, there may be a difference between these components. The true PM noise that is caused by the modulation of the VCO phase may create symmetrical and correlated sidebands, whereas the additive AM noise floor may not be necessarily correlated on the left and right sides of the carrier, unless it is converted to PM through hard-limiting, for example. Referring again to FIG. 19, in a typical VCO noise profile, the $1/f^3$ and $1/f^2$ areas on the left and right sides of the carrier may, therefore, be correlated.

Although the thermal noise added, for example, by tank loss is uncorrelated with respect to the two sides of the carrier, it may still be possible to have correlated thermal noise sideband through other mechanisms.

Figure 20:
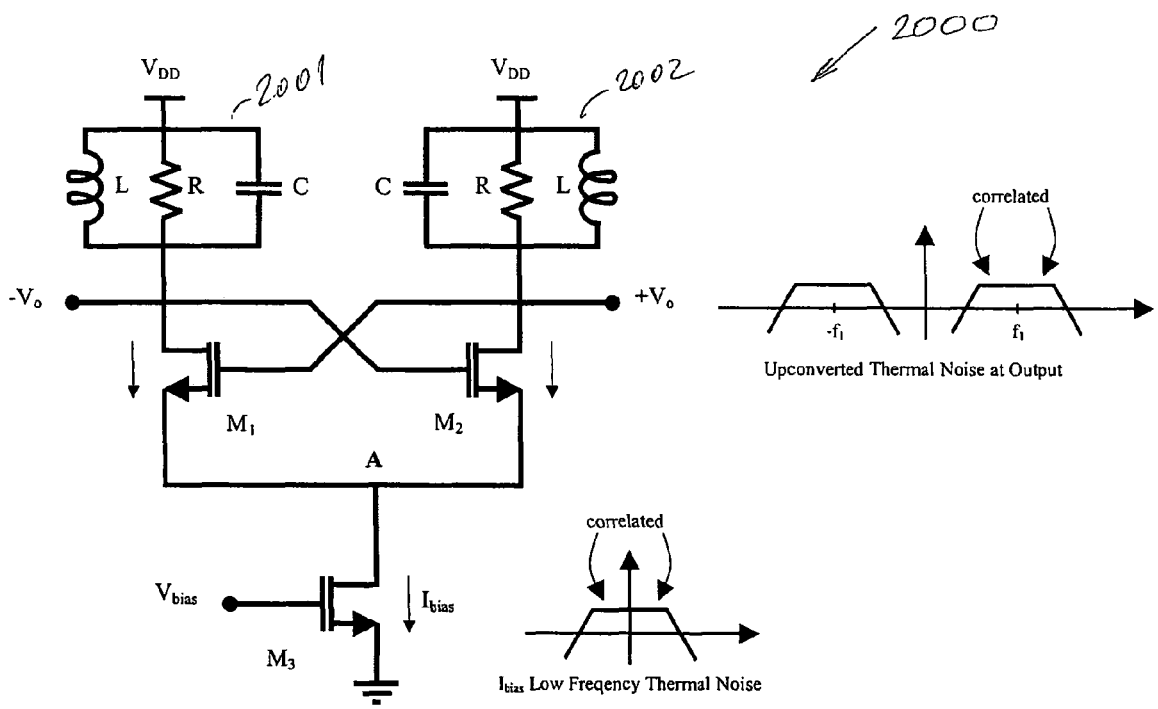
FIG. 20 is a schematic block diagram of a voltage controlled oscillator that may be utilized in accordance with an embodiment of the invention.

FIG. 20 is a schematic block diagram of a voltage controlled oscillator (VCO) 2000 that may be utilized in accordance with an embodiment of the invention. The VCO 2000 may comprise L-R-C circuits 2001 and 2002, transistors M1 and M2, and a grounded transistor M3. The cross-coupled transistors M1 and M2 may provide a negative resistance that may cancel out the resonance tank loss lumped into resistors R. Transistor M3 may provide the bias current. The thermal noise of resistors R may directly appear at the output and may be uncorrelated with respect to the sides of the carrier.

During operation, transistors M1 and M2 may turn on and off in every cycle of oscillation. This action may alternate the bias current between the two sides of the oscillator 2000 and may be similar to the mixing action that may occur in an integrated mixer. The low frequency thermal noise of M3 may be up-converted to around $f_1$, or the oscillation frequency, and may create correlated sideband. Because of the parasitic capacitance at node A, the thermal noise of M3 may have a finite cut-off frequency that may or may not cause folding of the noise spectrum onto itself. In any event, the sideband at the output due to the noise source may be correlated. Thus, part of the thermal noise at the output coming from resistors R may be uncorrelated with respect to the left and right sides of the carrier, while the part coming from transistor M3 may be correlated in that regard. The thermal far-end noise of an integrated VCO, therefore, may be neither completely correlated nor uncorrelated.

Referring again to FIG. 18, if the output of a VCO is hard-limited, the noise spectrum profile may be repeated at odd multiples of the oscillator frequency. The immediate vicinity of the $f_1$ oscillation frequency, or the $1/f^3$ and $1/f^2$ areas, may be correlated with respect to the left and right sides of the carrier. At any odd multiple of $f_1$, the phase noise spectrum and its mirrored version may be folded onto each other. The close-in phase noise and its mirrored version may, therefore, pass to the output with a gain of $$\left(\frac{2V_m}{\pi A_1}\right)^2$$

and may add to each other. Because the two side bands are correlated, the result may be four times the power of one of them. In this way, the close-in phase noise gain may be $$4\left(\frac{2V_m}{\pi A_1}\right)^2.$$

The power at $f_1$ at the output may be $$P_1\left(\frac{4V_m}{\pi A_1}\right)^2,$$

which may indicate that the gain for the carrier from input to the output may also equal $$4\left(\frac{2V_m}{\pi A_1}\right)^2.$$

Therefore, the ratio of the carrier to sideband ratios may not change around $1/f^3$ and $1/f^2$. In addition, phase noise at the output may remain the same as the input.

With regard to the thermal noise, it may depend on the level of correlation of sidebands and its bandwidth. Depending on where the noise floor is coming from, the thermal noise may start to fall off at some point. Even if the VCO noise profile extended to infinity, it may become bandlimited upon entering the limiter because of the limited input bandwidth of the limiter. The band limit may be M times the oscillation frequency of the VCO, which means the thermal noise folds onto itself M times. Therefore:

$$N_{Th} = 4N_{Th1} \cdot \left(\frac{2V_m}{\pi A_1}\right)^2 + (M-2)N_{Th1} \cdot \left(\frac{2V_m}{\pi A_1}\right)^2 \quad (50)$$

The first term on the right hand side of the equation comes from the fact that the correlated left and right sides, the sides close to carrier, may fold on top of each other once. The (M−2) replicas that fold back near the carrier may be uncorrelated. Equation (50) may be simplified to:

$$N_{Th} = (M + 2)N_{Th1} \cdot \left(\frac{2V_m}{\pi A_1}\right)^2 \quad (51)$$

For example, if M=2, the thermal noise may fold onto itself only twice, for correlated folding, and therefore the thermal noise floor may pass through with a gain of $$4\left(\frac{2V_m}{\pi A_1}\right)^2.$$

The far-end phase noise may also stay the same as the input. In this way, if the noise profile has a larger bandwidth, more folding of thermal noise may occur and the thermal noise level may relatively increase. In the general case of M>2, if the output signal of a VCO is applied to a high gain limiter, the close-in phase noise at the output of the limiter may remain the same, and the thermal noise floor may increase, depending on the effective bandwidth of the original noise profile.

In one aspect of the invention, a filter may be utilized in accordance with a limiter in order to filter out phase noise prior to limiting the signal and folding a phase noise harmonic on top of itself.

Figure 21:
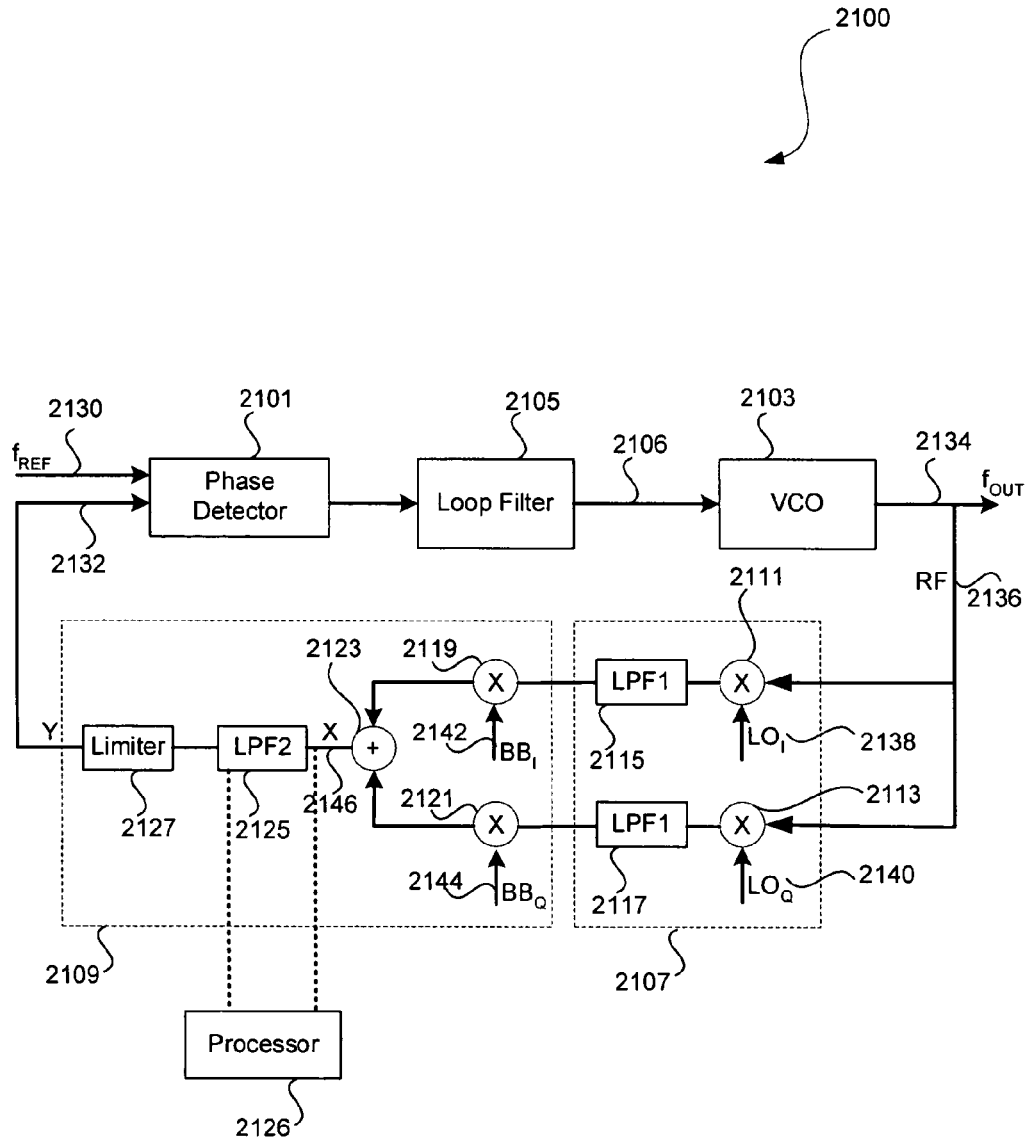
FIG. 21 is a schematic block diagram of a binary phase shift keying (PSK) modulator utilizing a limiter and a filter, in accordance with an embodiment of the invention.

FIG. 21 is a schematic block diagram of a binary phase shift keying (PSK) modulator 2100 utilizing a limiter and a filter, in accordance with an embodiment of the invention. Referring to FIG. 21, the PSK modulator 2100 may comprise a phase detector 2101, a loop filter 2105, a VCO 2103, a frequency translation module 2107, and a modulation mixing module 2109.

The phase detector 2101 may comprise suitable logic, circuitry and/or code and may be adapted to detect a phase and/or a frequency difference between a reference oscillation 2130 and a feedback oscillation 2132. The loop filter 2105 may be adapted to receive the difference signal from the phase detector 2101 and to convert it into a control signal 2106. The VCO 2103 may receive the control signal 2106 and may produce a modulated output oscillation 2134 based on the control signal 2106.

The frequency translation module 2107 may comprise downconversion mixers 2111 and 2113, and low pass filters 2115 and 2117. The downconversion mixer 2111 may be adapted to downconvert an in-phase component of the signal 2136 received from the VCO 2103 by utilizing an in-phase component of a local oscillation 2138. The downconversion mixer 2113 may be adapted to downconvert a quadrature component of the signal 2136 received from the VCO 2103 by utilizing a quadrature component of the local oscillation 2140.

During operation, the downconversion mixers 2111 and 2113 may generate a difference between the input signal 2136 and the local oscillator signals 2138 and 2140. The downconversion mixers 2111 and 2113, however, may also produce an additive frequency at their outputs, comprising the input signal 2136 and the local oscillator signals 2138 and 2140, respectively. The low pass filters 2115 and 2117 may be adapted to filter out the additive frequencies generated by the downconversion mixers 2111 and 2113.

The modulation mixing module 2109 may comprise modulation mixers 2119 and 2121, a summing module 2123, a low pass filter 2125 and a limiter 2127. The modulation mixer 2119 may be adapted to mix the in-phase component of a modulating signal 2142 with the downconverted signal received from the output of the low pass filter 2115. The modulation mixer 2121 may be adapted to mix the quadrature component of a modulating signal 2144 with the downconverted signal received from the output of the low pass filter 2117. The resulting mixed signals may be summed by the summing module 2123 to produce a modulated signal 2146. The modulated signal 2146 may then be filtered by the low pass filter 2125. The filtered signal may be limited by the limiter 2127 to produce the feedback signal 2132. The feedback signal 2132 may in turn be compared to the reference signal 2130 by the phase detector 2101.

In another aspect of the invention, the PSK modulator 2100 may comprise a processor 2126. The processor 2126 may comprise on-chip processor and may be configured to analyze spectral content of noise profile. In operation, the processor 2126 may be coupled to the output of the summing module 2123 and to the low-pass filter 2125. The processor may analyze the spectral content of the modulated signal 2146 and may determine filter characteristics, such as filter coefficients, for the low-pass filter 2125. In this way, the processor 2126 may configure the low-pass filter 2125 so that the low-pass filter may filter out one or more noise harmonics and avoid folding of those harmonics in the output signal after the limiter 2127.

The processor 2126 may also be a part of a portable analyzing device utilizing spectral analysis hardware, firmware and/or software, for example.

In a locked state, the signal output 2134 of the binary PSK modulator 2100 may be calculated as $f_{out}=f_{RF}\pm f_{BB}$. If bit '1' is constantly being transmitted, or $f_{out}=f_{RF}+f_{BB}$, the high frequency modulated signal 2134 may be down converted through mixing with $f_{LO}>f_{RF}$, utilizing the in-phase and quadrature components I and Q, respectively. At the output of this mixer, both downconverted ($f_{LO}-f_{out}$) and upconverted ($f_{LO}+f_{out}$) signals may exist. The low pass filter LPF1 2115 may be primarily used to reject the upconverted ($f_{LO}+f_{out}$) signals. The baseband modulation may be mixed with the downconverted signal in the I and Q paths and summed by the summing module 2123. At point X, $f_{LO}-f_{out}-f_{BB}=f_{LO}-f_{RF}$ may be obtained. The resulting signal 2146, after being filtered by the low-pass filter 2125 and limited by the limiter 2127, may be compared against a reference signal 2130 to generate the control signal 2106 for the VCO 2103. Prior to entering the phase detector 2101, the modulated signal 2146 may be hard-limited by the limiter 2127 to provide a rail-to-rail digital signal.

In a different aspect of the invention, the low pass filter 2125 may be selected with different filtering parameters to filter different phase noise characteristics within the modulated signal 2146.

Certain specification may also be met on the level of allowable spurious signal in the adjacent channel within the modulated signal 2146. For instance, at $3f_{BB}$ away from $f_{RF}$, the spur may be 60 dB down.

Figure 22:
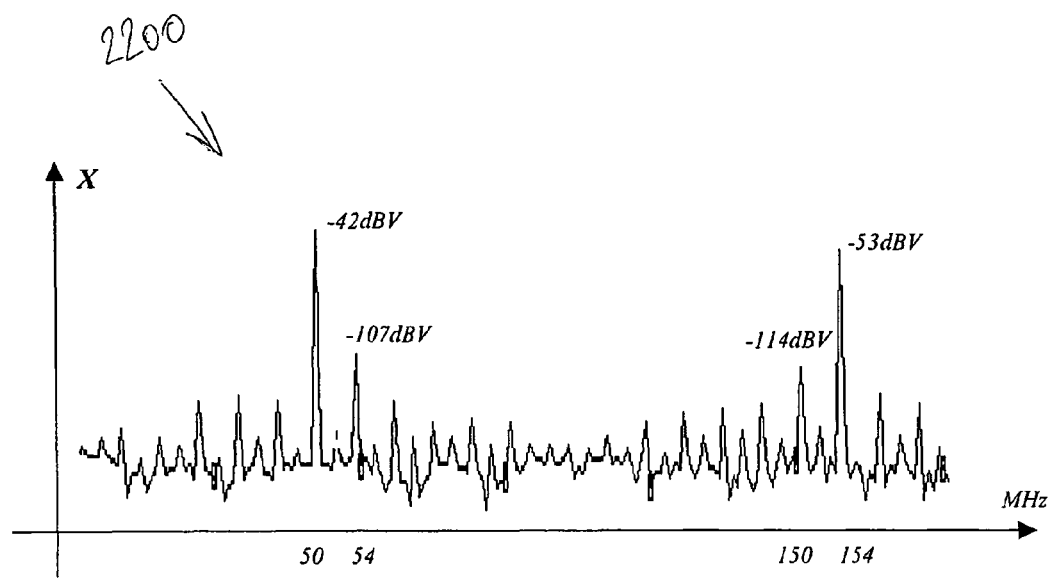
FIG. 22 is a graphical representation of an exemplary signal noise characteristic for a limited signal with filtration, in accordance with an embodiment of the invention.

FIG. 22 is a graphical representation 2200 of an exemplary signal noise characteristic for a limited signal with filtration, in accordance with an embodiment of the invention. In one aspect of the invention, it may be assumed that $f_{REF}$=50 MHz, $f_{BB}$=1 MHz, $f_{LO}$=550 MHz and $f_{RF}$=500 MHz. Referring again to FIG. 21, if bit "1" is being transmitted, $f_{out}$=551 MHz and $f_{LO}-f_{out}$=51 MHz. The downconversion mixers 2111 and 2113 may not be ideal and may add harmonics to both the input signal 2136 and the local oscillator signals 2138 and 2140. Therefore, the modulated signal 2146 at point X may also have energy around $3(f_{LO}-f_{out})$=153 MHz, which may not be filtered by the low pass filters 2115 and 2117. The downconverted signal may be mixed by the mixers 2119 and 2121 with $f_{BB}$ to produce 51 MHz-$f_{BB}$=50 MHz.

Referring to FIG. 22, it may be illustrated that because of the nonlinearity of the modulation mixers 2119 and 2121, the spectrum may also reproduce energy at 51 MHz+3$f_{BB}$=54 MHz. In this way, by pushing the nonlinearity below a minimum, the energy at 54 MHz may be reduced, and hence the adjacent channel specification may be met. However, the 153 MHz component from the output of the downconversion mixers may also be mixed with $f_{BB}$ in the modulation mixers and may produce spikes at 153 MHz+$f_{BB}$=154 MHz and 153 MHz−3$f_{BB}$=150 MHz, as illustrated on FIG. 22. If the effect of the limiter is ignored, the energy at around 150 MHz may be eventually filtered out by the loop filter 2105 in FIG. 21. Since the spike at 53 MHz is considerably low, the 3 MHz spec may be satisfied. Nonetheless, utilizing the results of the previous section, and by employing a unity gain limiter for simplicity, the 153 MHz spike may fold onto both 53 MHz and 47 MHz points with a gain of 0.5.

Therefore, on top of the existing signal at 53 MHz, there may also be a strong component at that frequency with a magnitude of −59 dBV, which may be 17 dB below the desired channel. By utilizing a low pass filter, the 153 MHz signal may be attenuated by at least 43 dB prior to the limiting action.

Figure 23:
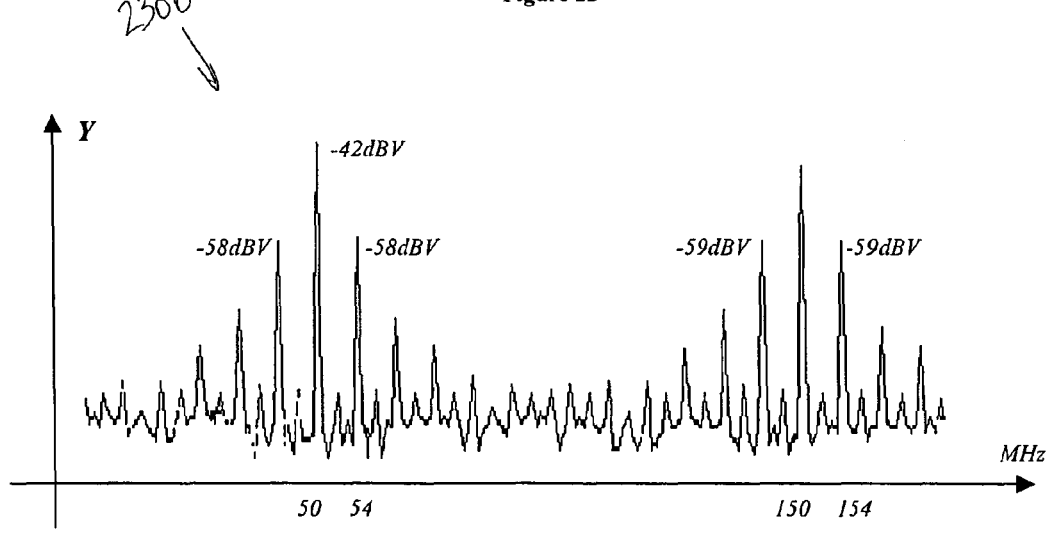
FIG. 23 is a graphical representation of an exemplary signal noise characteristic for a limited signal without filtration, in accordance with an embodiment of the invention.

FIG. 23 is a graphical representation 2300 of an exemplary signal noise characteristic for a limited signal without filtration, in accordance with an embodiment of the invention. Referring to FIG. 23, the graphical representation 2300 may illustrate the simulation results for a signal after a limiter without the use of a low pass filter prior to the limiting action.

Figure 24:
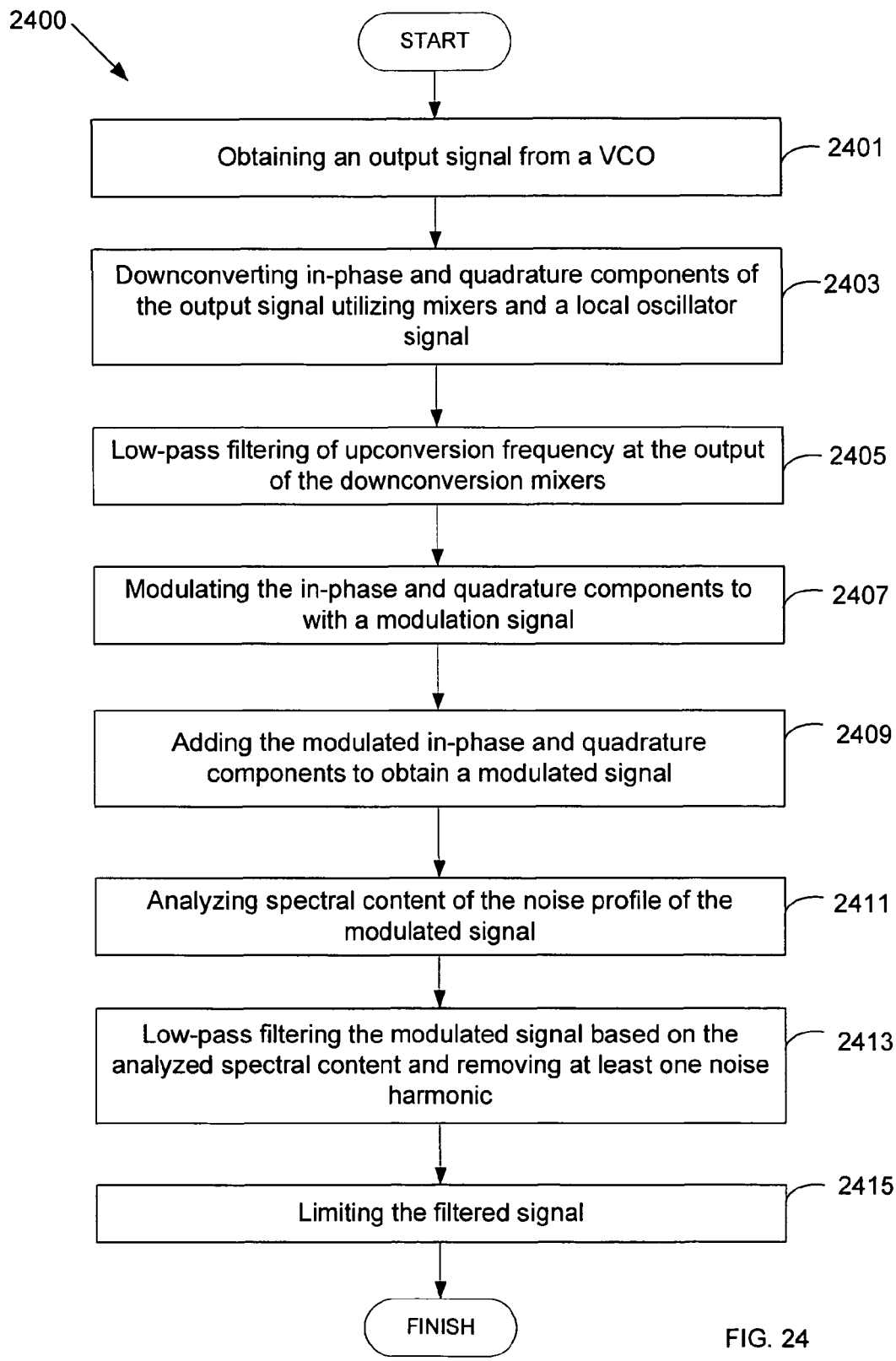
FIG. 24 is a flow diagram of an exemplary method for processing a sinusoidal wave signal with a phase noise profile, in accordance with an embodiment of the invention.

FIG. 24 is a flow diagram of an exemplary method 2400 for processing a sinusoidal wave signal with a phase noise profile, in accordance with an embodiment of the invention. At step 2401, an output signal may be obtained from a VCO. At step 2403, in-phase and quadrature components of the output signal may be downconverted utilizing mixers and a local oscillator signal, for example. The in-phase component of the output signal may be downconverted utilizing the in-phase component of a local oscillator signal. Similarly, the quadrature component of the output signal may be downconverted utilizing the quadrature component of the local oscillator signal.

At step 2405, an upconversion frequency at the output of the downconversion mixers may be filtered out so that the frequency representing a difference between the local oscillator frequency and the input frequency may remain. At step 2407, the in-phase and quadrature components may be modulated with a modulation signal within modulation mixers, for example. At step 2409, the modulated in-phase and quadrature components may be added to obtain a modulated signal. At step 2411, spectral content of the noise profile of the modulated signal may be analyzed. For example, an on-chip processor, or a removable device, may be utilized to analyze the spectral content. At step 2411, the modulated signal may be low-pass filtered to remove phase noise characteristics, prior to the signal being limited. The spectral content analysis may be utilized to determine one or more filter coefficients which configure the low-pass filter. At step 2413, the filtered modulated signal may be limited by a limiter.

While the invention contemplates the application of a filter in accordance with a limiter within a binary PSK modulator, or a phase-locked loop, the invention is not limited in this way. A filter in accordance with a limiter may also be applied to other circuits or arrangements so that a phase-noise profile of a signal may be reduced prior to the signal being limited by the limiter.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

The invention claimed is:

1. A method for processing a signal with a corresponding noise profile, the method comprising:

analyzing spectral content of the noise profile;

predicting an effect on the spectral content based on the signal traversing a limiter;

generating one or more filter coefficients of a filter based on the predicted effect to avoid generation of noise harmonics and infinite folding in the signal as a result of the signal traversing the limiter;

filtering the signal with the filter in accordance with the determined one or more filter coefficients; and limiting the filtered signal with the limiter.

2. The method according to claim 1, wherein the noise profile comprises a phase noise profile.

3. The method according to claim 1, wherein the signal comprises at least one of a sinusoidal signal and a noise signal.

4. The method of claim 3, wherein the limiter converts the sinusoidal signal into a substantially square wave signal.

5. The method according to claim 1, wherein the predicting comprises predicting an effect on the spectral content based on at least one characteristic of the limiter.

6. The method according to claim 1, wherein the filtering comprises low pass filtering.

7. The method according to claim 1, wherein the limiting comprise hard-limiting the filtered signal.

8. The method according to claim 1, wherein the predicting comprises predicting close in-phase noise in the spectral content based on:
the signal traversing the limiter with non-infinite gain, and
predicting a linear to nonlinear transition characteristic of the limiter.

9. A system for processing a signal with a corresponding noise profile, the system comprising::
a limiter;
a processor configured to:
analyze spectral content of the noise profile,
predict an effect on the spectral content based on the signal traversing a limiter, and
generate one or more filter coefficients based on the predicted effect to avoid generation of noise harmonics and infinite folding in the signal as a result of the signal traversing the limiter; and
a filter configured to filter the signal in accordance with the determined one or more filter coefficients;
wherein the limiter is configured to limit said filtered signal.

10. The system according to claim 9, wherein the noise profile comprises a phase noise profile.

11. The system according to claim 9, wherein the signal comprises at least one of a sinusoidal signal and a noise signal.

12. The system of claim 11, wherein the limiter converts the sinusoidal signal into a substantially square wave signal.

13. The system according to claim 9, wherein the processor is configured to predict an effect on the spectral content based on at least one characteristic of the limiter.

14. The system according to claim 9, wherein the filter comprises a low-pass filter.

15. The system according to claim 9, wherein the limiter comprises a hard-limiter configured to limit the filtered signal.

16. The system according to claim 9, wherein the processor is configured to predict close in-phase noise in the spectral content based on:
the signal traversing the limiter, wherein the limiter has non-infinite gain, and
a linear to non-linear transition characteristic of the limiter.

17. A method for processing a signal with a corresponding noise profile, the method comprising:
modulating the signal;
analyzing spectral content of the noise profile of the modulated signal;
predicting an effect on the spectral content based on the modulated signal traversing a limiter;
generating one or more filter coefficients of a filter based on the predicted effect to avoid generation of noise harmonics and infinite folding in the modulated signal as a result of the signal traversing the limiter;
filtering the modulated signal with the filter in accordance with the determined one or more filter coefficients; and
limiting the filtered modulated signal with the limiter.

18. The method according to claim 17, comprising downconverting the signal prior to the modulating.

19. The method according to claim 18, comprising downconverting at least one signal component of the signal.

20. The method according to claim 19, wherein the at least one signal component of the signal comprises one or both of an in-phase signal component and a quadrature signal component.

21. The method according to claim 20, comprising modulating the in-phase signal component and the quadrature signal component with a modulation frequency.

22. The method according to claim 21, comprising adding the modulated in-phase signal component and the modulated quadrature signal component to obtain a downconverted modulated signal.

23. The method according to claim 18, comprising mixing the downconverted signal with a local oscillator signal.

24. The method according to claim 23, comprising filtering the mixed signal.

25. The method according to claim 24, wherein the filtering comprises low pass filtering of a sum of a carrier frequency of the signal and a reference frequency of the local oscillator signal.

26. The method of claim 17, wherein the limiter converts a sinusoidal input into a substantially square wave output.

27. A system for processing a signal with a corresponding noise profile, the system comprising:
a limiter;
a modulator configured to modulate the signal;
a processor configured to:
analyze spectral content of the noise profile of the modulated signal,
predict an effect on the spectral content based on the modulated signal traversing a limiter, and
generate one or more filter coefficients based on the predicted effect to avoid generation of noise harmonics and infinite folding, in the modulated signal as a result of the modulated signal traversing the limiter; and
a filter configured to filter the modulated signal in accordance with the determined one or more filter coefficients;
wherein the limiter is configured to limit the filtered modulated signal.

28. The system according to claim 27, comprising a downconverter configured to downconvert the signal prior to the modulating.

29. The system according to claim 28, wherein the downconverter is configured to downconvert at least one signal component of the signal.

30. The system according to claim 29, wherein the at least one signal component of the signal comprises one or both of an in-phase signal component and a quadrature signal component.

31. The system according to claim 30, comprising a modulation mixer configured to modulate the in-phase signal component and the quadrature signal component with a modulation frequency.

32. The system according to claim 28, comprising a mixer configured to mix the downconverted signal with a local oscillator signal.

33. The system according to claim 32, comprising a downconversion filter configured to filter the mixed signal.

34. The system according to claim 33, wherein the downconversion filter comprises a low pass filter configured to filter a sum of a carrier frequency of the signal and a reference frequency of said local oscillator signal.

35. The system of claim 27, wherein the limiter converts a sinusoidal input into a substantially square wave output.

36. A system for processing a signal with a corresponding noise profile, the system comprising:
at least one processor configured to modulate the signal;
the at least one processor configured to analyze spectral content of the noise profile of the modulated signal;
the at least one processor configured to predict an effect on the spectral content based on the modulated signal traversing a limiter;

the at least one processor configured to generate one or more filter coefficients based on the predicted effect to avoid generation of noise harmonics and infinite folding in the modulated signal as a result of the signal traversing the limiter;

the at least one processor configured to filter the modulated signal in accordance with the determined one or more filter coefficients; and the at least one processor configured to limit the filtered modulated signal.

37. The system according to claim 36, wherein the at least one processor is configured to downconvert the signal prior to the modulating.

38. The system according to claim 37, wherein the at least one processor is configured to downconvert the signal prior to the modulating.

39. The system according to claim 38, wherein the at least one signal component of the signal comprises one or both of an in-phase signal component and a quadrature signal component.

40. The system according to claim 39, wherein the at least one processor is configured to modulate the in-phase signal component and the quadrature signal component with a modulation frequency.

41. The system according to claim 37, wherein the at least one processor is configured to mix the downconverted signal with a local oscillator signal.

42. The system according to claim 41, wherein the at least one processor is configured to filter the mixed signal.

43. The system according to claim 42, wherein the at least one processor is configured to filter a sum of a carrier frequency of the signal and a reference frequency of the local oscillator signal.

44. The system of claim 36, wherein the limiter converts a sinusoidal input into a substantially square wave output.

* * * * *